(12) United States Patent
Park et al.

(10) Patent No.: US 9,588,367 B2
(45) Date of Patent: Mar. 7, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Je Hyeong Park, Hwaseong-si (KR); Un Byoll Ko, Yeoju-si (KR); Kyung-Bae Kim, Seoul (KR); Seung Ho Yang, Hwaseong-si (KR); Se Joon Oh, Suwon-si (KR); Ki Kyung Youk, Bucheon-si (KR)

(73) Assignee: Samsung Display Co., Ltd. (KR)

( * ) Notice: Subject to any disclaimer, the term of this patent is extended or adjusted under 35 U.S.C. 154(b) by 34 days.

(21) Appl. No.: 14/528,960

(22) Filed: Oct. 30, 2014

(65) Prior Publication Data

US 2015/0346543 A1 Dec. 3, 2015

(30) Foreign Application Priority Data

May 28, 2014 (KR) ........................ 10-2014-0064525

(51) Int. Cl.
*G02F 1/1339* (2006.01)
*G02F 1/1333* (2006.01)
(Continued)

(52) U.S. Cl.
CPC ...... *G02F 1/133377* (2013.01); *G02F 1/1337* (2013.01); *G02F 1/1362* (2013.01);
(Continued)

(58) Field of Classification Search
CPC ............. G02F 1/133377; G02F 1/1337; G02F 1/1362; G02F 1/136286; H01L 27/124; H01L 27/1259
See application file for complete search history.

(56) References Cited

U.S. PATENT DOCUMENTS 7,430,031 B2    9/2008  Park
7,872,717 B2    1/2011  Jung et al.
(Continued)

FOREIGN PATENT DOCUMENTS

JP    2009-276675 A    11/2009
JP    2011-017786 A     1/2011
(Continued)

OTHER PUBLICATIONS

Shin et al., "Dielectric Constant of Binary Mixtures", Journal of Materials Science Letters, vol. 8, Issue No. 12, pp. 1383-1385, 1989.

*Primary Examiner* — Nathanael R Briggs
(74) *Attorney, Agent, or Firm* — Innovation Counsel LLP

(57) ABSTRACT

A liquid crystal display includes: a substrate including a plurality of pixel areas; a thin film transistor disposed on the substrate; a pixel electrode connected with the thin film transistor; and a roof layer disposed facing the pixel electrode, wherein a plurality of microcavities are disposed between the pixel electrode and the roof layer, and a liquid crystal layer including liquid crystal molecules is disposed in the plurality of microcavities, and wherein each microcavity includes a first area and a second area partitioned by a liquid crystal injection hole formation area, and a first alignment layer in the first area and a second alignment layer in the second area are formed of different materials.

9 Claims, 33 Drawing Sheets

(51) Int. Cl.
  *G02F 1/1337*    (2006.01)
  *H01L 27/12*    (2006.01)
  *G02F 1/1362*    (2006.01)

(52) U.S. Cl.
  CPC ...... *G02F 1/136286* (2013.01); *H01L 27/124* (2013.01); *H01L 27/1259* (2013.01)

(56) References Cited

U.S. PATENT DOCUMENTS

| | | |
|---|---|---|
| 8,102,491 B2 | 1/2012 | Ishida et al. |
| 2008/0036960 A1* | 2/2008 | Ding ................ G02F 1/133377 |
| | | 349/156 |
| 2012/0044452 A1* | 2/2012 | Matsuoka ......... G02F 1/133512 |
| | | 349/158 |
| 2012/0236238 A1 | 9/2012 | Kim et al. |
| 2014/0117385 A1 | 5/2014 | Park et al. |

FOREIGN PATENT DOCUMENTS

| | | |
|---|---|---|
| KR | 10-1998-0003715 A | 3/1998 |
| KR | 10-0928483 B1 | 11/2009 |

\* cited by examiner

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2014-0064525 filed in the Korean Intellectual Property Office on May 28, 2014, the entire contents of which are incorporated herein by reference.

BACKGROUND (a) Technical Field

The present disclosure relates to a liquid crystal display and a manufacturing method thereof.

(b) Description of the Related Art

A liquid crystal display is a type of flat panel display which is widely used. A liquid crystal display typically includes two sheets of display panels on which field generating electrodes (such as a pixel electrode and a common electrode) are formed, and a liquid crystal layer interposed therebetween.

An image can be displayed on the liquid crystal display by applying a voltage to the field generating electrodes to generate an electric field in the liquid crystal layer, determining the orientation of liquid crystal molecules of the liquid crystal layer based on the generated electric field, and controlling polarization of incident light.

Different technologies have been developed to form liquid crystal displays. For example, a technology for forming a liquid crystal display (by forming a plurality of microcavities and filling liquid crystal in the microcavities) has been developed. In a conventional liquid crystal display, two sheets of substrates are typically used. However, the aforementioned technology allows constituent elements to be formed on a single substrate, thereby reducing the weight, thickness, and form factor of the display device.

In a liquid crystal display, characteristics such as transmittance, visibility, and contrast ratio are important. Research has been conducted to improve and control the above characteristics, for example, by forming a plurality of sub-pixels and setting voltage-transmittance curves (V-T curves) of the sub-pixels to be different from one another.

The above information disclosed in this Background section is only for enhancement of understanding of the background of the inventive concept and therefore it may contain information that does not form the prior art that is already known in this country to a person of ordinary skill in the art.

SUMMARY

The present disclosure is directed to a liquid crystal display having improved visibility, and a method for manufacturing the same.

According to an exemplary embodiment of the inventive concept, a liquid crystal display includes: a substrate including a plurality of pixel areas; a thin film transistor disposed on the substrate; a pixel electrode connected with the thin film transistor; and a roof layer disposed facing the pixel electrode, wherein a plurality of microcavities are disposed between the pixel electrode and the roof layer, and a liquid crystal layer including liquid crystal molecules is disposed in the plurality of microcavities, and wherein each microcavity includes a first area and a second area partitioned by a liquid crystal injection hole formation area, and a first alignment layer in the first area and a second alignment layer in the second area are formed of different materials.

In one embodiment, the first alignment layer and the second alignment layer may have different dielectric constants.

In one embodiment, a difference between the dielectric constants of the first alignment layer and the second alignment layer may be equal to or greater than 2.

In one embodiment, the liquid crystal injection hole formation area may include a first liquid crystal injection hole formation area and a second liquid crystal injection hole formation area alternately arranged in a column direction, and a thin film transistor may be formed in an area corresponding to the second liquid crystal injection hole formation area.

In one embodiment, the plurality of pixel areas may include a first pixel area and a second pixel area neighboring each other, wherein a first sub-pixel electrode and a second sub-pixel electrode may be disposed in the first pixel area, and a third sub-pixel electrode and a fourth sub-pixel electrode may be disposed in the second pixel area, wherein the first liquid crystal injection hole formation area may be disposed between the second sub-pixel electrode and the third sub-pixel electrode, and the second liquid crystal injection hole formation area may be disposed between the first sub-pixel electrode and the second sub-pixel electrode and between the third sub-pixel electrode and the fourth sub-pixel electrode.

In one embodiment, a single liquid crystal injection hole may be disposed in each of the first liquid crystal injection hole formation area and the second liquid crystal injection hole formation area.

In one embodiment, a partitioning wall may be formed in a portion facing the liquid crystal injection hole with reference to the first liquid crystal injection hole formation area and the second liquid crystal injection hole formation area.

In one embodiment, the partitioning wall may include a downward protruding portion of the roof layer.

In one embodiment, the liquid crystal display may further include an interlayer insulating layer disposed between the thin film transistor and the pixel electrode, wherein the partitioning wall may include an upward protruding portion of the interlayer insulating layer.

In one embodiment, when an electric field is applied to the liquid crystal layer, a tilting degree of the liquid crystal molecules in the first area and a tilting degree of the liquid crystal molecules in the second area may be different from each other.

According to another exemplary embodiment of the inventive concept, a method for manufacturing a liquid crystal display is provided. The method includes: forming a thin film transistor on a substrate; forming a pixel electrode to be connected with a terminal of the thin film transistor; forming a sacrificial layer on the pixel electrode; forming a roof layer on the sacrificial layer; forming a microcavity including a first area where a first liquid crystal injection hole is formed and a second area where a second liquid crystal injection hole is formed, wherein the microcavity is formed by removing the sacrificial layer; injecting a first alignment material onto the first area through the first liquid crystal injection hole; injecting a second alignment material onto the second area through the second liquid crystal injection hole; injecting a liquid crystal material through the first liquid crystal injection hole and the second liquid crystal injection hole; and forming a capping layer on the roof layer to cover the first liquid crystal injection hole and the second liquid crystal injection hole, wherein the first alignment material and the second alignment material are different.

In one embodiment, the first alignment material and the second alignment material may have different dielectric constants.

In one embodiment, forming the sacrificial layer may further include forming an opening at an edge of the first area and an edge of the second area.

In one embodiment, the roof layer may fill the opening so that a partitioning wall is formed when forming the roof layer.

In one embodiment, the partitioning wall may be disposed at one side of the microcavity corresponding to the first area or another side of the microcavity corresponding to the second area.

In one embodiment, the substrate may include a first pixel area and a second pixel area, a first sub-pixel electrode and a second sub-pixel electrode may be formed in the first pixel area and a third sub-pixel electrode and a fourth sub-pixel electrode may be formed in the second pixel area, and a first liquid crystal injection hole formation area may be formed between the second sub-pixel electrode and the third sub-pixel electrode, and a second liquid crystal injection hole formation area may be formed between the first sub-pixel electrode and the second sub-pixel electrode and between the third sub-pixel electrode and the fourth sub-pixel electrode.

In one embodiment, a single liquid crystal injection hole may be formed in each of the first liquid crystal injection hole formation area and the second liquid crystal injection hole formation area.

In one embodiment, forming the sacrificial layer may further include forming an opening at an edge of the first area and an edge of the second area.

In one embodiment, the roof layer may fill the opening so that a partitioning wall is formed when forming the roof layer.

In one embodiment, the partitioning wall may be disposed at one side of the microcavity corresponding to the first area or another side of the microcavity corresponding to the second area.

According to the above embodiments of the inventive concept, a microcavity is space-partitioned and a characteristic (for example, transmittance) of an alignment layer formed in each space may be different from the characteristic of another alignment layer in each space by differentiating a dielectric constant, thereby improving visibility of the liquid crystal display.

DETAILED DESCRIPTION

Figure 1:
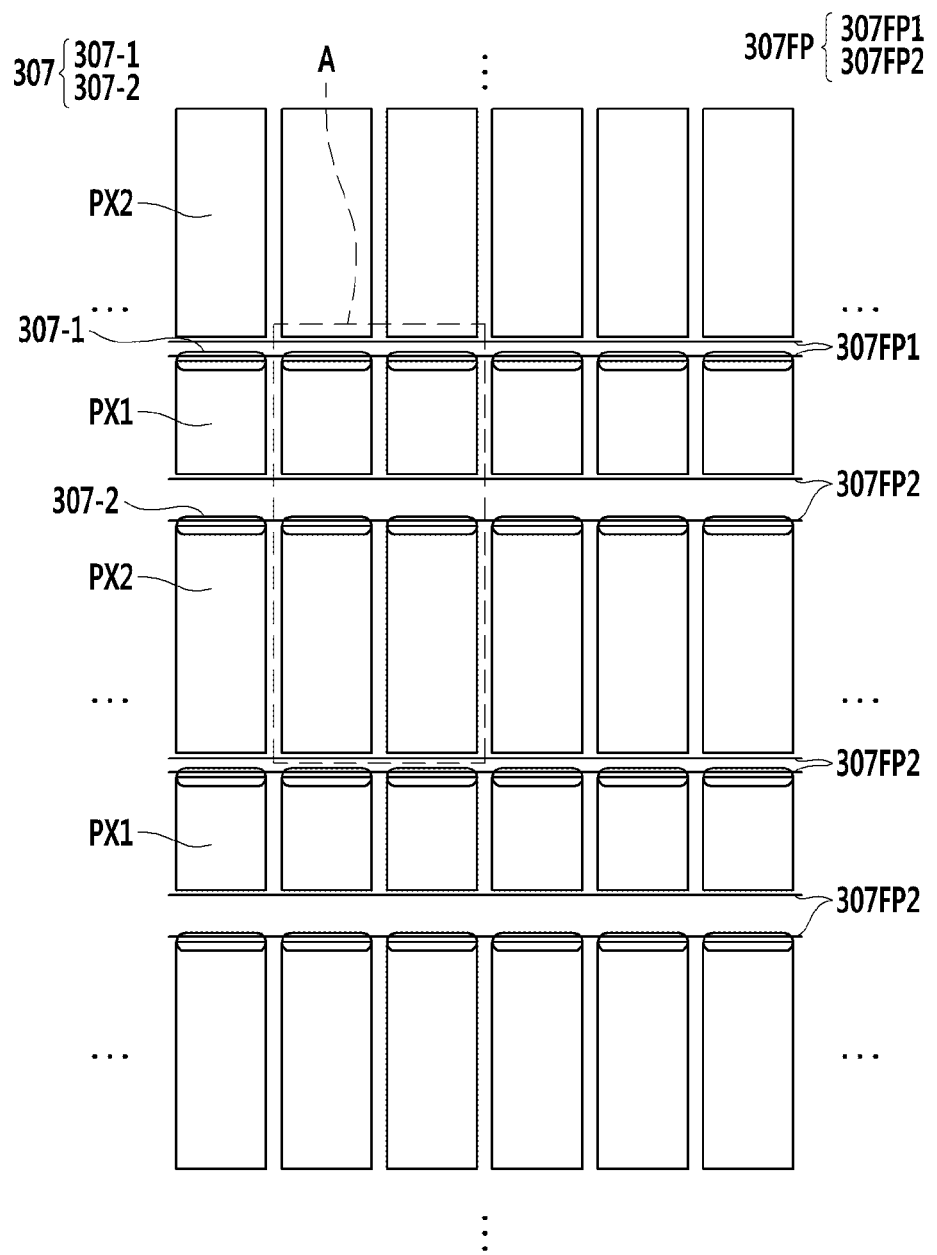
FIG. 1 is a top plan view of a liquid crystal display according to an exemplary embodiment of the inventive concept.

Exemplary embodiments of the inventive concept will next be described with reference to the accompanying drawings. As those skilled in the art would realize, the described embodiments may be modified in various ways without departing from the spirit or scope of the inventive concept.

In the drawings, the thicknesses of the layers, films, panels, regions, etc., may be exaggerated for clarity. It will be understood that when a layer is referred to as being "on" another layer or substrate, it can be disposed directly on the other layer or substrate, or with one or more intervening layers or substrates being present. Like reference numerals designate like elements throughout the specification.

FIG. 1 is a top plan view of a liquid crystal display according to an exemplary embodiment of the inventive concept.

Referring to FIG. 1, a liquid crystal display according to an exemplary embodiment of the inventive concept includes liquid crystal injection hole formation areas 307FP. The liquid crystal injection hole formation areas 307FP include first liquid crystal injection hole formation areas 307FP1 and second liquid crystal injection hole formation areas 307FP2. In the exemplary embodiment, pixel areas PX corresponding to a screen displaying area may include first sub-pixel areas PX1 and second sub-pixel areas PX2. The pixel areas may be arranged in four directions. The first liquid crystal injection hole formation areas 307FP1 and the second liquid crystal injection hole formation areas 307FP2 are respectively disposed between the first sub-pixel areas PX1 and the second sub-pixel areas PX2. In the above embodiment, the first liquid crystal injection hole formation areas 307FP1 and the second liquid crystal injection hole formation areas 307FP2 may be alternately arranged along a column direction.

A first alignment material is injected onto the first sub-pixel area PX1 through the first liquid crystal injection hole formation area 307FP1 such that a first alignment layer may be formed, and a second alignment material is injected onto the second sub-pixel area PX2 through the second liquid crystal injection hole formation area 307FP2 such that a second alignment layer may be formed. The first alignment material and the second alignment material may be formed of different types of alignment materials. For example, the first alignment material and the second alignment material may have different dielectric constants. In this case, a dielectric constant difference between the first alignment material and the second alignment material may be 2 or more.

Next, the liquid crystal display according to the exemplary embodiment of the inventive concept will be described in detail with reference to FIG. 2 to FIG. 6.

Figure 2:
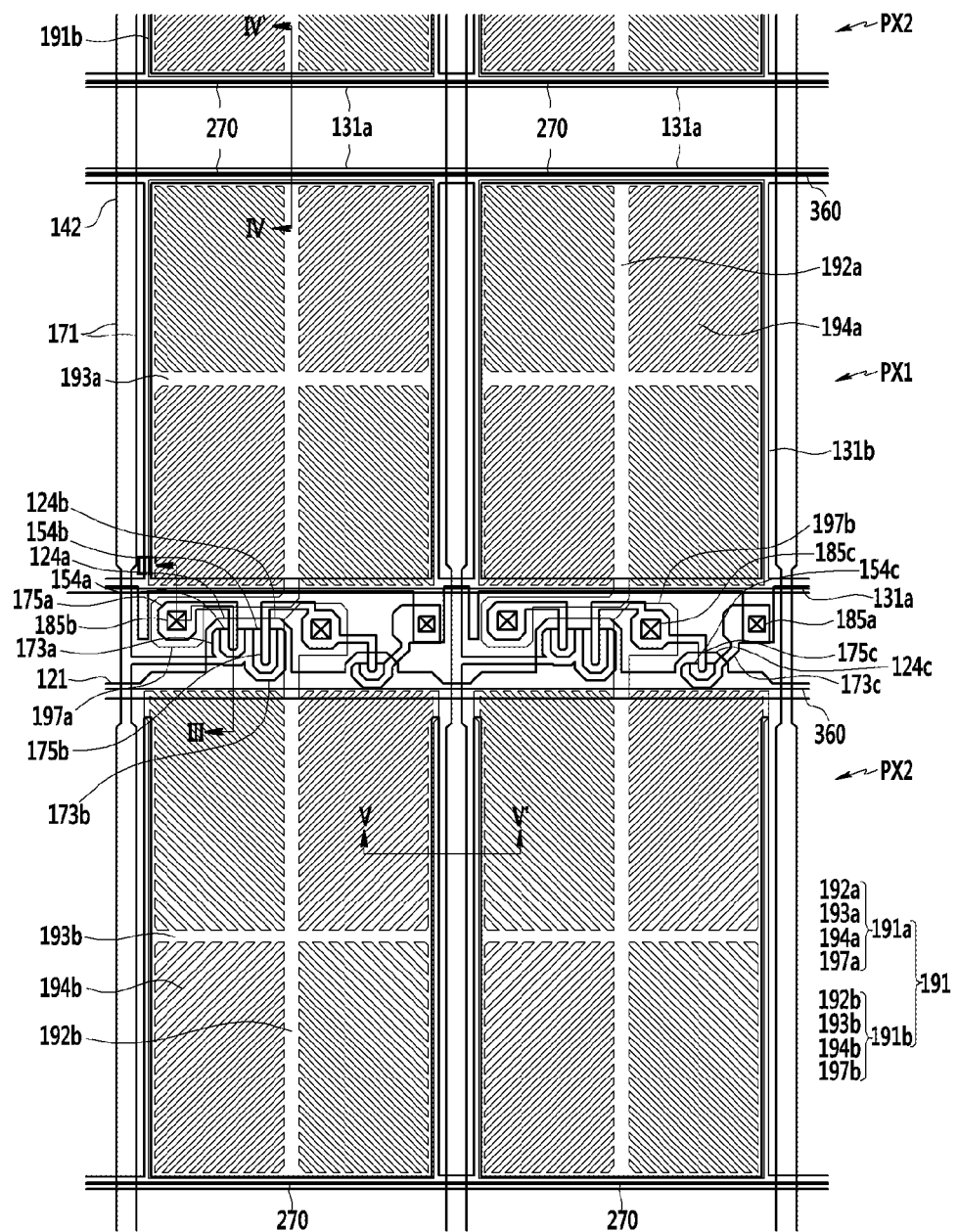
FIG. 2 is a top plan view of a pixel in the liquid crystal display of FIG. 1.
Figure 3:
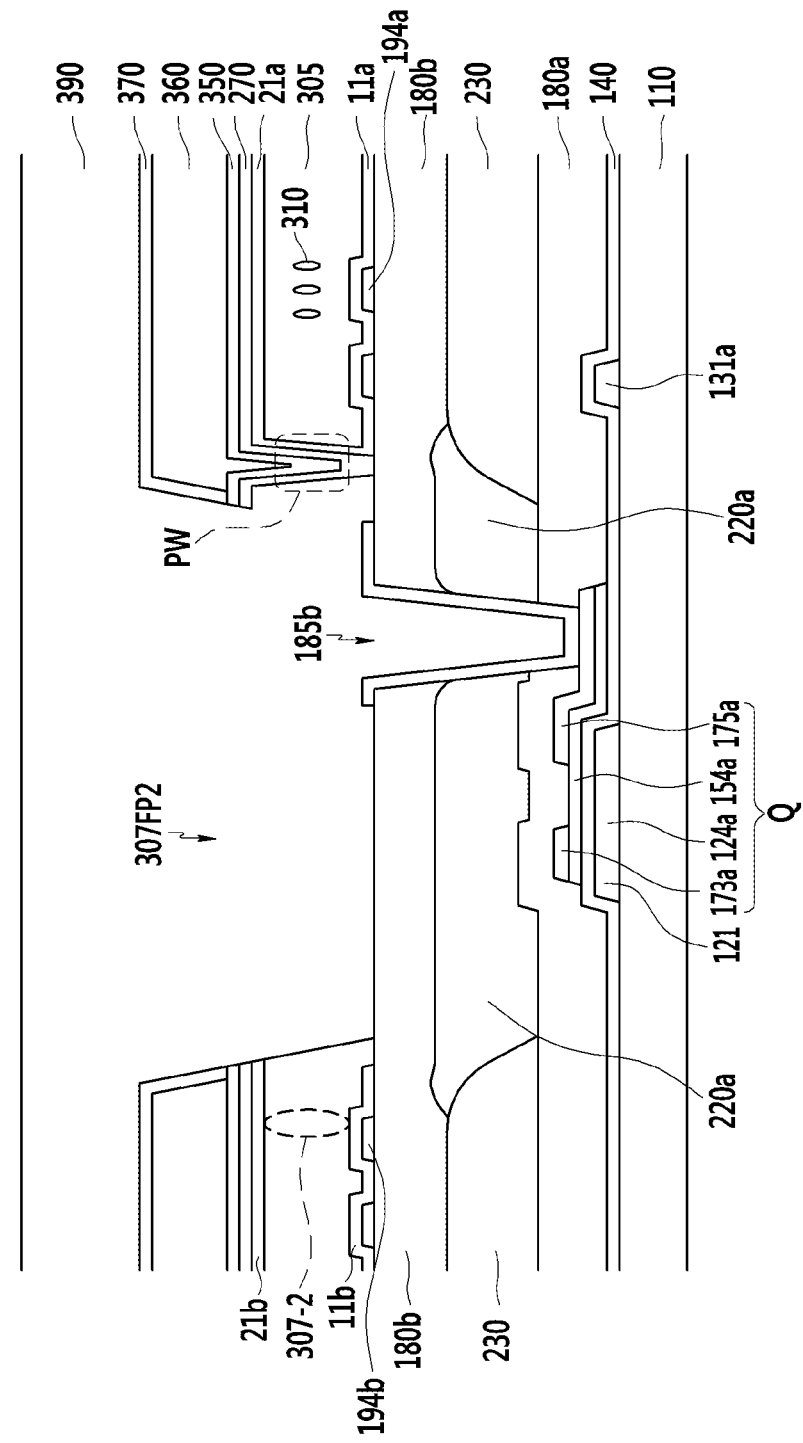
FIG. 3 is a cross-sectional view taken along line III-III' of FIG. 2.
Figure 4:
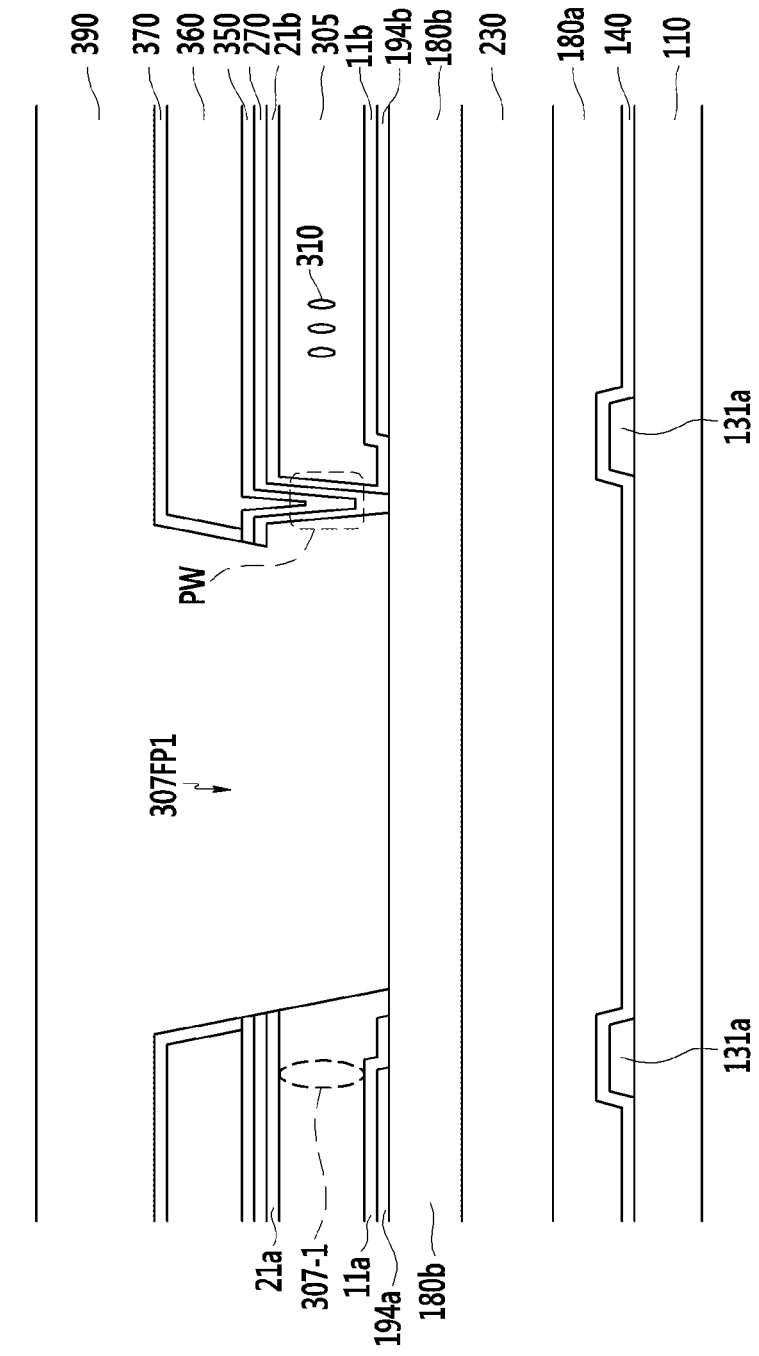
FIG. 4 is a cross-sectional view taken along line IV-IV' of FIG. 2.
Figure 5:
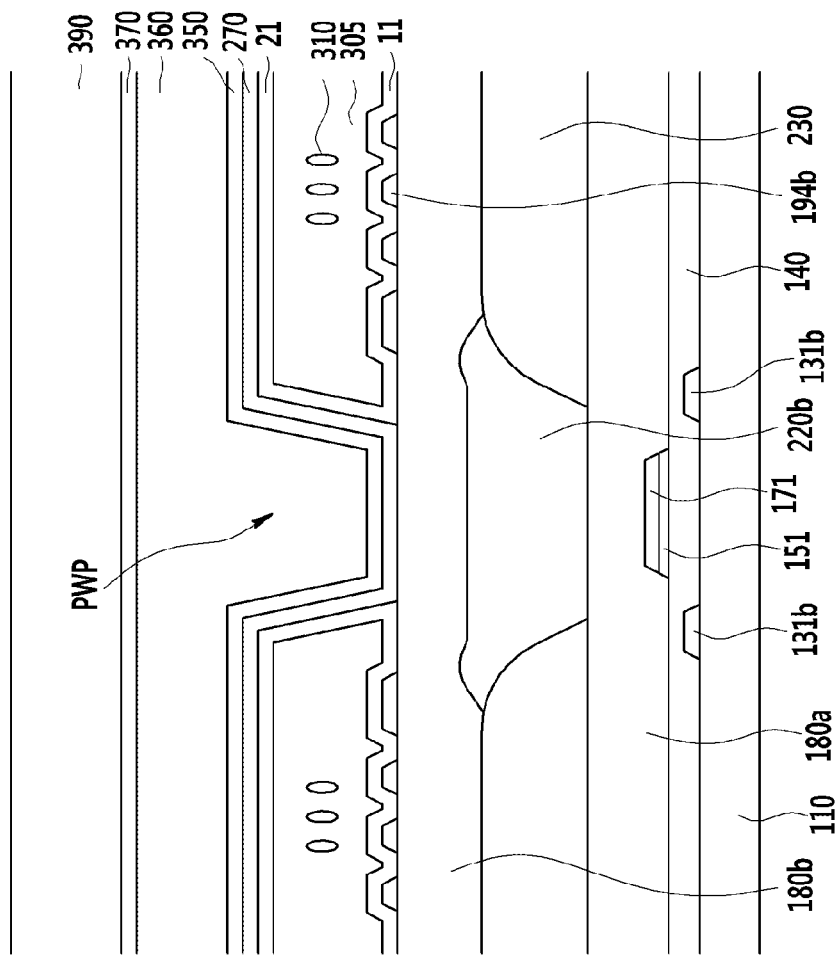
FIG. 5 is a cross-sectional view taken along line V-V' of FIG. 2.
Figure 6:
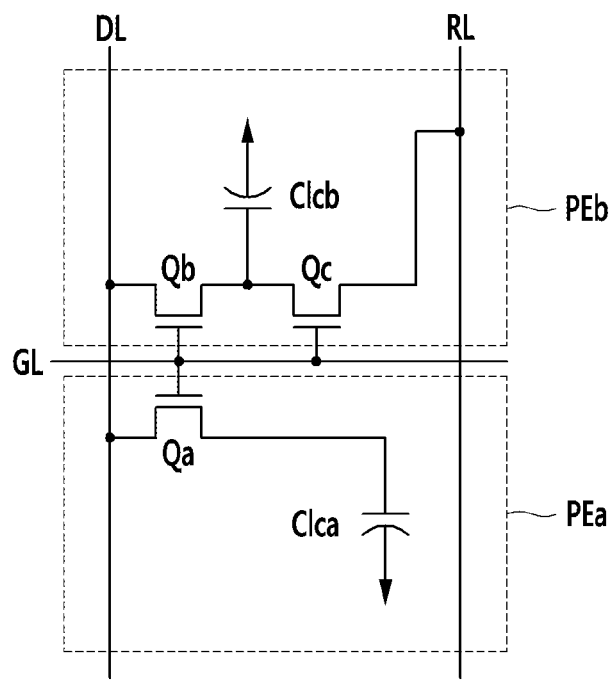
FIG. 6 is an equivalent circuit diagram of the pixel of FIG. 2.

FIG. 2 is a top plan view of a pixel in the liquid crystal display of FIG. 1. Specifically, FIG. 2 illustrates region A of FIG. 1 in greater detail. FIG. 3 is a cross-sectional view taken along line III-III' of FIG. 2. FIG. 4 is a cross-sectional view taken along line IV-IV' of FIG. 2. FIG. 5 is a cross-sectional view taken along line V-V' of FIG. 2. FIG. 6 is an equivalent circuit diagram of the pixel of FIG. 2.

Referring to FIG. 2, FIG. 4, FIG. 5, and FIG. 6, a gate line 121 and storage electrode lines 131a and 131b are disposed on a first substrate 110. The first substrate 110 may be made of transparent glass or plastic. The storage electrode lines 131a and 131b include a horizontal portion 131a extending parallel with the gate line 121 and a vertical portion 131b extending from the horizontal portion 131a in a direction that crosses the gate line 121.

The gate line 121 transmits a gate signal and extends in a substantially horizontal direction. The gate line 121 includes gate electrodes 124a, 124b, and 124c protruding from the gate line 121.

The gate lines 121 and the gate electrodes 124a, 124b, and 124c may be made of at least one material selected from a group comprising an aluminum-based metal (such as aluminum (Al) or an aluminum alloy), a silver-based metal (such as silver (Ag) or a silver alloy), and a copper-based metal (such as copper (Cu) or a copper alloy).

In the exemplary embodiment, the gate lines 121 and the gate electrodes 124a, 124b, and 124c are formed by a single film. However, the inventive concept is not limited thereto. For example, in some other embodiments, the gate lines 121 and the gate electrodes 124a, 124b, and 124c may be formed having a dual-film or triple-film structure.

When the gate lines 121 and the gate electrodes 124a, 124b, and 124c have a dual-film structure, the gate lines 121 and the gate electrodes 124 may be formed by a lower film and an upper film, respectively. The lower film may be made of at least one material selected from a group comprising a molybdenum-based metal (such as molybdenum (Mo) or a molybdenum alloy), chrome (Cr), a chrome alloy, titanium (Ti), a titanium alloy, tantalum (Ta), a tantalum alloy, manganese (Mn), and a manganese alloy. The upper film may be made of at least one material selected from a group comprising an aluminum-based metal (such as aluminum (Al) or an aluminum alloy), a silver-based metal (such as silver (Ag) or a silver alloy), and a copper-based metal (such as copper (Cu) or a copper alloy). When the gate lines 121 and the gate electrodes 124a, 124b, and 124c have a triple-film structure, the triple-film structure may include films having different physical properties.

A gate insulating film 140 is formed on the gate line 121. A first contact hole 185a connecting the storage electrode line 131a and a third source electrode 173c is formed in the gate insulating layer 140.

Semiconductor layers 154a, 154b, and 154c are disposed on the gate insulating layer 140. The semiconductor layers may include a linear semiconductor (not shown) disposed in a location overlapping a data line 171.

The data line 171 is connected with data conductors 173a, 173b, 173c, 175b, and 175c. The data conductors include a first source electrode 173a, a second source electrode 173b connected with the first source electrode 173a, the third source electrode 173c, a first drain electrode 175a, a second drain electrode 175b, and a third drain electrode 175c connected with the second drain electrode 175b. The data conductors are disposed on the semiconductor layers 154a, 154b, and 154c.

Referring to FIG. 2 and FIG. 3, the first gate electrode 124a, the first source electrode 173a, and the first drain electrode 175a, together with the first semiconductor layer 154a, collectively constitute a first thin film transistor Qa, and a channel of the thin film transistor Qa is formed in a semiconductor layer portion 154a between the first source electrode 173a and the first drain electrode 175a. Similarly, the second gate electrode 124b, the second source electrode 173b, and the second drain electrode 175b, together with the second semiconductor layer 154b, collectively constitute a second thin film transistor Qb, and a channel of the second thin film transistor Qb is formed in the semiconductor layer portion 154b between the second source electrode 173b and the second drain electrode 175b. Likewise, the third gate electrode 124c, the third source electrode 173c, and the third drain electrode 175c, together with the third semiconductor layer 154c, collectively constitute a third thin film transistor Qc, and a channel of the third thin film transistor Qc is formed in the semiconductor layer portion 154c between the third source electrode 173c and the third drain electrode 175c.

The data conductors 173a, 173b, 173c, 175a, 175b, and 175c may be made of at least one material selected from a group comprising an aluminum-based metal (such as aluminum (Al) or an aluminum alloy), a silver-based metal (such as silver (Ag) or a silver alloy), and a copper-based metal (such as copper (Cu) or a copper alloy).

In the present exemplary embodiment, the data conductors 173a, 173b, 173c, 175a, 175b, and 175c are formed by a single film, but are not limited thereto. For example, in some other embodiments, the data conductors 173a, 173b, 173c, 175a, 175b, and 175c may be formed having a dual-film or triple-film structure.

When the data conductors 173a, 173b, 173c, 175a, 175b, and 175c have a dual-film structure, the data conductors 173a, 173b, and 173c may be formed by a lower layer and the data conductors 175a, 175b, and 175c may be formed by an upper layer. The lower layer may be made of at least one material selected from a group comprising a molybdenum-based metal (such as molybdenum (Mo) or a molybdenum alloy), chrome (Cr), a chrome alloy, titanium (Ti), a titanium alloy, tantalum (Ta), a tantalum alloy, manganese (Mn), and a manganese alloy. The upper layer may be made of at least one material selected from a group comprising an aluminum-based metal (such as aluminum (Al) or an aluminum alloy), a silver-based metal (such as silver (Ag) or a silver alloy), and a copper-based metal (such as copper (Cu) or a copper alloy). When the data conductors 173a, 173b, 173c, 175a, 175b, and 175c have a triple-film structure, layers having different physical properties may be formed adjacent to each other.

In some embodiments, ohmic contact layers (not illustrated) may be formed between the semiconductor layers 154a, 154b, and 154c and the source electrodes 173a, 173b, and 173c, and between the semiconductor layers 154a, 154b, and 154c and the drain electrodes 175a, 175b, and 175c.

A first interlayer insulating layer 180a is formed on the data conductors 173a, 173b, 173c, 175a, 175b, and 175c and the semiconductor layers 154a, 154b, and 154c. The first interlayer insulating layer 180a may include an inorganic insulating material (such as a silicon nitride or a silicon oxide) or an organic insulating material.

A color filter 230 and light blocking members 220a and 220b are formed on the first interlayer insulating layer 180a.

The light blocking members 220a and 220b have a lattice structure having an opening corresponding to an area for displaying an image, and include a material which does not transmit light. The color filter 230 is formed in each opening of the light blocking members 220a and 220b. The light blocking members 220a and 220b include a horizontal light blocking member 220a formed in a direction parallel to the gate line 121, and a vertical light blocking member 220b formed in a direction parallel to the data line 171.

The color filter 230 may display one of the primary colors (such as the three primary colors red, green, and blue). However, the color filter 230 is not limited to the three primary colors red, green, and blue. In some other embodiments, the color filter 230 may display one of cyan, magenta, yellow, and white-based colors. In addition, the color filter 230 may be made of a material that is capable of displaying different colors for every adjacent pixel.

A second interlayer insulating layer 180b covering the color filter 230 and the light blocking members 220a and 220b is formed on the color filter 230 and the light blocking members 220a and 220b. The second interlayer insulating layer 180b may include an inorganic insulator (such as a silicon nitride (SiNx) or a silicon oxide (SiOx)) or an organic insulator. When a step is generated due to a thickness difference between the color filter 230 and the light blocking members 220a and 220b, the second interlayer insulating layer 180b includes the organic insulator to reduce or remove the step.

A second contact hole 185b exposing the first drain electrode 175a, and a third contact hole 185c exposing the second drain electrode 175b or the third drain electrode 175c, are formed in the color filter 230, the light blocking members 220a and 220b, and the interlayer insulating layers 180a and 180b.

A pixel electrode 191 is formed on the second interlayer insulating layer 180b. The pixel electrode 191 may be made of a transparent conductive material (such as ITO or IZO). The pixel electrode 191 includes a first sub-pixel electrode 191a and a second sub-pixel electrode 191b. The first sub-pixel electrode 191a is physically and electrically connected with the first drain electrode 195a through the second contact hole 185b, and the second sub-pixel electrode 191b is physically and electrically connected with the second drain electrode 175b or the third drain electrode 175c through the third contact hole 185c. Thus, the first sub-pixel electrode 191a and the second sub-pixel electrode 191b respectively receive a data voltage from the first drain electrode 175a and the second drain electrode 175b. The pixel electrodes 191a and 191b may be made of a transparent conductor (such as ITO or IZO).

The first sub-pixel electrode 191a and the second sub-pixel electrode 191b are separated from each other with the gate line 121 interposed therebetween, and are disposed at upper and lower sides, respectively, so as to be adjacent to each other in a column direction.

Each of the first subpixel electrode 191a and the second subpixel electrode 191b is shaped as a quadrangle, and include cross stems including vertical stems 192a and 192b and horizontal stems 193a and 193b crossing the vertical stems 192a and 192b, respectively. Further, the first subpixel electrode 191a and the second subpixel electrode 191b include a plurality of minute branches 194a and 194b, and a lower protrusion 197a and an upper protrusion 197b, respectively.

The lower protrusion 197a is connected with a lower end of the vertical stem 192a of the first sub-pixel electrode 191a, and has a wider area than the vertical stem 192a. The lower protrusion 197a is physically and electrically connected with the first drain electrode 175a through the second contact hole 185b, and the first sub-pixel electrode 191a receives a data voltage from the first drain electrode 175a. The upper protrusion 197b is connected with an upper end of the vertical stem 192b of the second sub-pixel electrode 191b, and has a wider area than the vertical stem 192b. The upper protrusion 197b is physically and electrically connected with the second drain electrode 175b or the third drain electrode 175c through the third contact hole 185c, and the second sub-pixel electrode 191b receives a data voltage from the second drain electrode 175b.

The respective sub-pixel electrodes 191a and 191b of the pixel electrode 191 are divided into four subregions by the horizontal stems 193a and 193b and the vertical stems 192a and 192b. The minute branches 194a and 194b extend obliquely from the horizontal stems 193a and 193b and the vertical stems 192a and 192b at an angle of approximately 45° or 135° with the gate lines 121a or the horizontal stems 193a and 193b. Also, the minute branches 194a and 194b of the two adjacent subregions may extend perpendicularly to each other.

The thin film transistors and the pixel electrode described above is one example of a structure for improving side visibility. It should be noted that the structure of the thin film transistors and the design of the pixel electrode are not limited to the above exemplary embodiment, but may be modified in different ways by those skilled in the art.

A lower alignment layer 11 is formed on the pixel electrode 191, and may serve as a vertical alignment layer. The lower alignment layer 11 may be a liquid crystal alignment layer formed of polyimide or the like.

An upper alignment layer 21 is positioned at a portion facing the lower alignment layer 11, and a microcavity 305 is formed between the lower alignment layer 11 and the upper alignment layer 21. A liquid crystal material including liquid crystal molecules 310 is injected into the microcavity 305, and the microcavity 305 has liquid crystal injection holes 307-1 and 307-2. The microcavities 305 may be formed in a column direction, that is, a vertical direction of the pixel electrode 191. In an exemplary embodiment, an alignment material forming the alignment layers 11 and 21 and a liquid crystal material including the liquid crystal molecules 310 may be injected into the microcavity 305 using capillary force.

Referring to FIG. 1, FIG. 3, and FIG. 4, the microcavity 305 is divided in a vertical direction by a first liquid crystal injection hole formation area 307FP1 and a second liquid crystal injection formation area 307FP2. The first liquid crystal injection hole formation area 307FP1 is disposed between second sub-pixel electrodes 191b of different pixel areas that neighbor each other in a column direction. The second liquid crystal injection formation area 307FP2 is disposed in a portion that overlaps the gate line 121, and is disposed in plural along a direction in which the gate line 121 extends. Each of the plurality of microcavities 305 in the present exemplary embodiment may be disposed corresponding to a pixel area PX1 and PX2, and the pixel area may correspond to an image displaying area.

In the present exemplary embodiment, a liquid crystal injection hole may be formed in one of the first sub-pixel area PX1 and the second sub-pixel area PX2 facing each other in the liquid crystal injection hole formation areas 307FP1 and 307FP2. For example, as shown in FIG. 1 and FIG. 4, a first liquid crystal injection hole 307-1 is formed at an edge of the first sub-pixel area PZ1, and a partition wall PW is formed at an edge of the second sub-pixel PX2 disposed corresponding to the edge of the first sub-pixel area PX1 in the first liquid crystal injection hole formation area 307FP1. In this case, as shown in FIG. 1 and FIG. 3, a second liquid crystal injection hole 307-2 is formed at an edge of the second sub-pixel area PX2, and a partition wall PW is formed at an edge of the first sub-pixel area PX1 disposed corresponding to the edge of the second sub-pixel area PX2 in the second liquid crystal injection hole formation area 307FP2.

In the present exemplary embodiment, the partition wall PW may be formed comprising a common electrode 270, a lower insulating layer 350, and a roof layer 360.

In the above-described structure of the liquid crystal injection hole 307 and the partitioning wall PW, different types of alignment materials can be injected respectively into a first sub-pixel area PX1 and a second sub-pixel area PX2 included in a single pixel area. Thus, as shown in FIG. 3 and FIG. 4, first alignment layers 11a and 21a may be formed in the first sub-pixel area PX, second alignment layers 11b and 21b may be formed in the second sub-pixel area PX2, and the first alignment layers and the second alignment layers may be formed of different types of alignment materials.

The common electrode 270 and the lower insulating layer 350 are disposed on the upper alignment layer 21. The common electrode 270 receives a common voltage, and generates an electric field with the pixel electrode 191 (to which the data voltage is applied) so as to determine a tilting direction of the liquid crystal molecules 310 disposed in the microcavity 305 between the two electrodes. The common electrode 270 forms a capacitor with the pixel electrode 191 and thus maintains an applied voltage after the thin film transistor is turned off. The lower insulating layer 350 may be made of a silicon nitride (SiNx) or a silicon oxide (SiOx).

In the present exemplary embodiment, the common electrode 270 is formed on the microcavity 305. However, in another exemplary embodiment, the common electrode 270 may be disposed below the microcavity 305, thereby enabling liquid crystal driving according to an in-plane switching mode.

The roof layer 360 is disposed on the lower insulating layer 350. The roof layer 360 supports the microcavity 305, which is a space between the pixel electrode 191 and the common electrode 270, so as to maintain the shape of the microcavity 305. The roof layer 306 may include a photoresist or other organic materials.

An upper insulating layer 370 is disposed on the roof layer 360. The upper insulating layer 370 may contact an upper surface of the roof layer 360. The upper insulating layer 370 may be made of a silicon nitride (SiNx) or a silicon oxide (SiO$_x$).

In the present exemplary embodiment, a capping layer 390 fills the liquid crystal injection hole formation area 307FP and covers the liquid crystal injection hole 307 of the microcavity 305 exposed by the liquid crystal injection hole formation area 307FP. The capping layer 390 may include an organic material or an inorganic material.

As shown in FIG. 5, in the present exemplary embodiment, the partition wall formation portion PWP is formed between horizontally neighboring microcavities 305. The partition wall formation portion PWP may extend along the data line 171, and may be covered by the capping layer 390. The lower insulating layer 350, the common electrode 270, the upper insulating layer 370, and the roof layer 360 are filled in the partition wall formation portion PWP, and the structure may form a partition wall to partition or define the microcavity 305. In the present exemplary embodiment, the partition wall formation portion PWP structure is formed between the microcavities 305, and therefore less stress is generated even when the substrate 110 is bent. As a result, the degree of deformation of the cell gap may be significantly reduced.

FIG. 6 is an equivalent circuit diagram of the pixel of FIG. 2.

Referring to FIG. 6, alignment of a signal line and a pixel in the liquid crystal display and a driving method thereof according to the exemplary embodiment of the inventive concept will be described.

Referring to FIG. 6, a pixel PX of the liquid crystal display according to the exemplary embodiment includes a plurality of signal lines including a gate line GL for transferring a gate signal, a data line DL for transferring a data signal, and a divided reference voltage line RL for transferring a divided reference voltage. The pixel PX further includes first, second, and third switching elements Qa, Qb, and Qc connected to the plurality of signal lines, and first and second liquid crystal capacitors Clca and Clcb. In the above-described exemplary embodiment, the reference voltage line RL is formed comprising the storage electrode lines 131a and 131b. In another exemplary embodiment, a reference voltage line for transmitting a divided reference voltage may be formed separately from the storage electrode lines.

The first switching element Qa and the second switching element Qb are respectively connected with the gate line GL and the data line DL, and the third switching element Qc is connected with an output terminal of the second switching element Qb and the reference voltage line RL.

The first switching element Qa and the second switching element Qb are three-terminal elements (such as thin film transistors) comprising control, input, and output terminals. The control terminals of the first switching element Qa and the second switching element Qb are connected with the gate line GL. The input terminals of the first switching element Qa and the second switching element Qb are connected with the data line DL. An output terminal of the first switching element Qa is connected with the first liquid crystal capacitor Clca, and an output terminal of the second switching element Qb is connected to input terminals of the second liquid crystal capacitor Clcb and the third switching element Qc.

The third switching element Qc is also a three-terminal element (such as a thin film transistor) comprising control, input, and output terminals. For the third switching element Qc, the control terminal is connected with the gate line GL, the input terminal is connected with the second liquid crystal capacitor Clcb, and the output terminal is connected with the reference voltage line RL.

When a gate-on signal Von is applied to the gate line GL, the first switching element Qa, the second switching element Qb, and the third switching element Qc connected to the gate line GL are turned on. Accordingly, the data voltage applied to the data line DL is applied to a first electrode PEa and a second electrode PEb through the first switching element Qa and second switching element Qb, respectively. In this case, the data voltages applied to the first electrode PEa and the second electrode PEb may be the same. However, according to the exemplary embodiment of the inventive concept, the voltage applied to the second electrode PEb is divided through the third switching element Qc which is connected with the second switching element Qb in series. Accordingly, the voltage applied to the second electrode PEb is less than the voltage applied to the first electrode PEa.

In the liquid crystal display according to the exemplary embodiment of the inventive concept, a pixel area is divided and a different voltage is applied to each of the divided pixel areas. Also, an alignment layer having a different dielectric constant is formed in each of the divided areas so that each divided area has a different transmittance, thereby further improving visibility.

It should be noted that the above-described signal lines, pixel alignment, and driving method of the liquid crystal display are merely exemplary, and may be modified in various ways.

Figure 7:
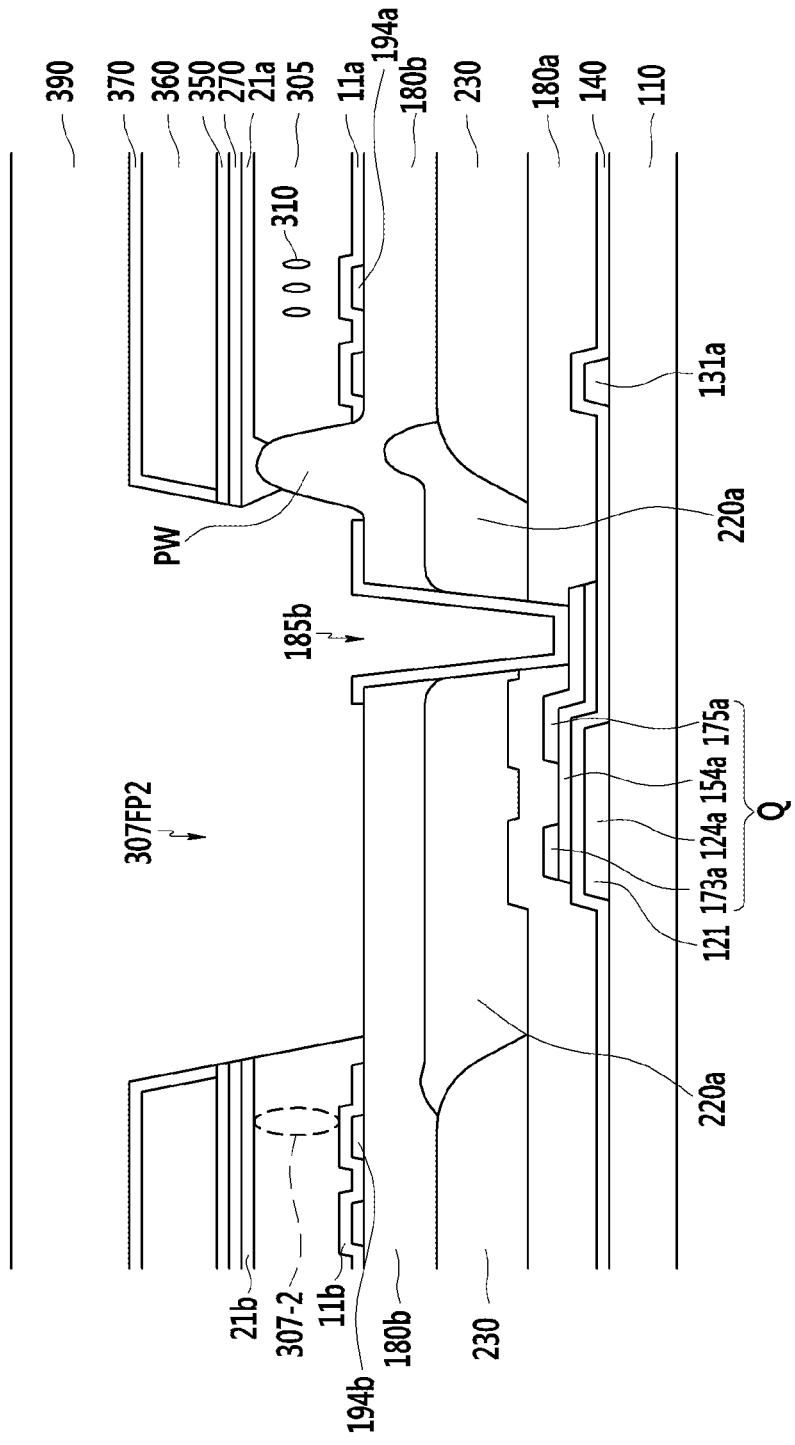
FIG. 7 is a cross-sectional view of a liquid crystal display according to another exemplary embodiment of the inventive concept taken along line III-III' of FIG. 1.
Figure 8:
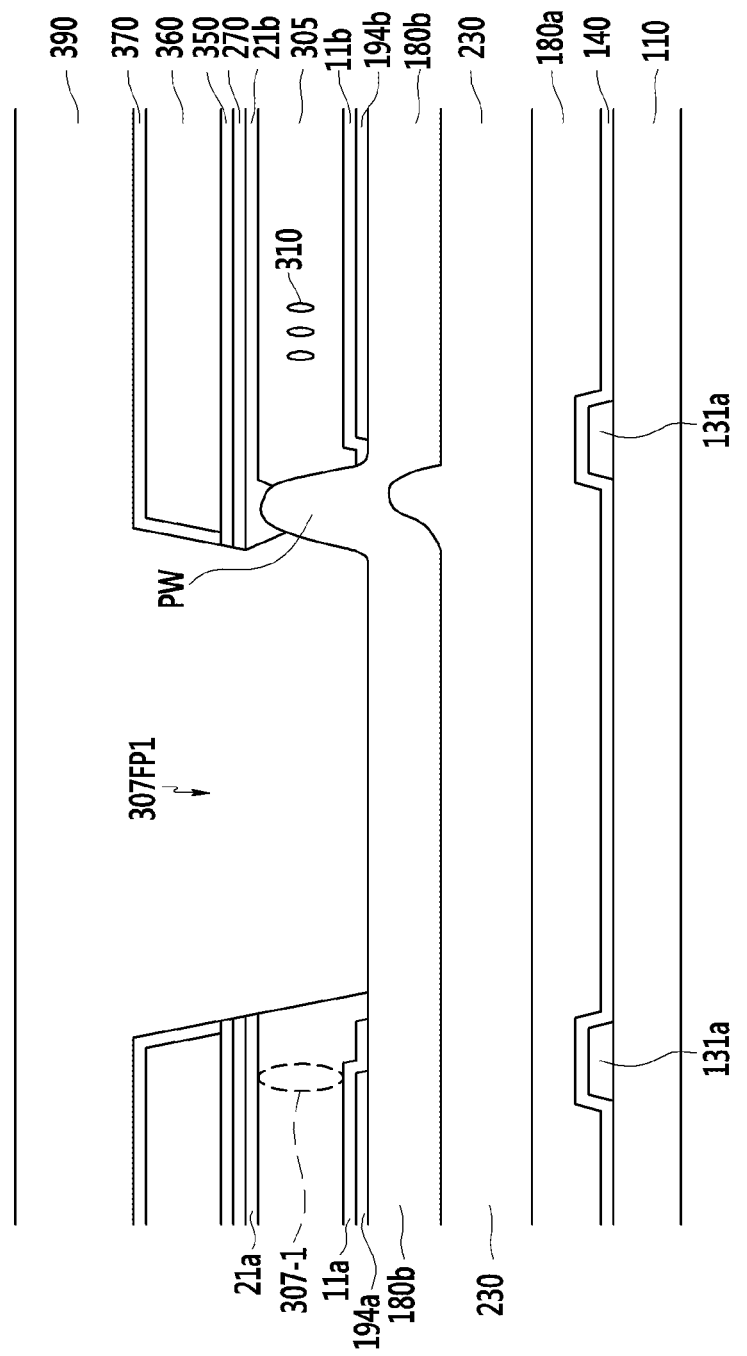
FIG. 8 is a cross-sectional view of a liquid crystal display according to the another exemplary embodiment of the inventive concept taken along line IV-IV' of FIG. 1.

FIG. 7 is a cross-sectional view of a liquid crystal display according to another exemplary embodiment of the inventive concept taken along line III-III' of FIG. 1. FIG. 8 is a cross-sectional view of the liquid crystal display according to the another exemplary embodiment of the inventive concept taken along line IV-IV' of FIG. 1.

The exemplary embodiment of FIG. 7 and FIG. 8 is substantially the same as the exemplary embodiment of FIG. 1 to FIG. 6, except for the structure of a partitioning wall PW disposed in a portion corresponding to a liquid crystal injection hole formation area 307FP.

Referring to FIG. 7 and FIG. 8, the partitioning wall PW has a structure in which a second interlayer insulating layer 180b partially protrudes upward. To form the protruding structure, an area where a color filter 230 and a light blocking member 220a below the second interlayer insulating layer 180b overlapping with each other is increased in thickness to form a step. As a result, the second interlayer insulating layer 180b formed through a subsequent process may have a step, thereby forming a partitioning wall PW. In the present exemplary embodiment, the partitioning wall PW is disposed at a distance from a common electrode 270 or the lower insulating layer 350 and a roof layer 360.

Next, a method for manufacturing the liquid crystal display according to an exemplary embodiment of the inventive concept will be described with reference to FIG. 9 to FIG. 31. It should be noted that the manufacturing method is merely exemplary and may be modified in various ways.

FIG. 9 to FIG. 31 are cross-sectional views of the liquid crystal display at different stages of manufacture according to an exemplary method of manufacturing the liquid crystal display. Specifically, FIG. 9, FIG. 12, FIG. 15, FIG. 18, FIG. 20, FIG. 24, FIG. 27, and FIG. 29 sequentially illustrate cross-sectional views taken along line III-III' of the liquid crystal display of FIG. 2. FIG. 10, FIG. 13, FIG. 16, FIG. 19, FIG. 21, FIG. 25, FIG. 28, and FIG. 30 sequentially illustrate cross-sectional views taken along line IV-IV' of the liquid crystal display of FIG. 2. FIG. 11, FIG. 14, FIG. 17, FIG. 22, and FIG. 31 sequentially illustrate cross-sectional views taken along line V-V' of the liquid crystal display of FIG. 2. FIG. 23 and FIG. 26 are top plan views illustrating the process of injecting different types of liquid crystal into the liquid crystal display according to the exemplary method.

Referring to FIG. 2, FIG. 9, FIG. 10, and FIG. 11, gate lines 121 extending in a horizontal direction for forming a generally-known switching element, a gate insulating layer 140 disposed on the gate lines 121, semiconductor layers 154a, 154b, and 154c formed on the gate insulating layer 140, and source electrodes 173a, 173b, and 173c and drain electrodes 175a, 175b, and 175c are formed on a substrate 110. A data line 171 connected with a first source electrode 173a may extend in a direction perpendicular to the gate line 121 while crossing the gate line 121.

A first interlayer insulating layer 180a is formed on data conductors 171, 173a, 173b, 173c, 175a, 175b, and 175c, and on the exposed semiconductor layers 154a, 154b, and 154c. The data conductors include the source electrodes 173a, 173b, and 173c, the drain electrodes 175a, 175b, and 175c, and the data line 171.

A color filter 230 is formed in a portion corresponding to each pixel area on the first interlayer insulating layer 180a, and light blocking members 220a and 220b are formed between the color filters 230.

A second interlayer insulating layer 180b is formed on (and covering) the color filter 230 and the light blocking members 220a and 220b. Contact holes 185a and 185b are formed through the second interlayer insulating layer 180b to electrically and physically connect the pixel electrode 191 and the drain electrodes 175a, 175b, and 175c.

Figure 9:
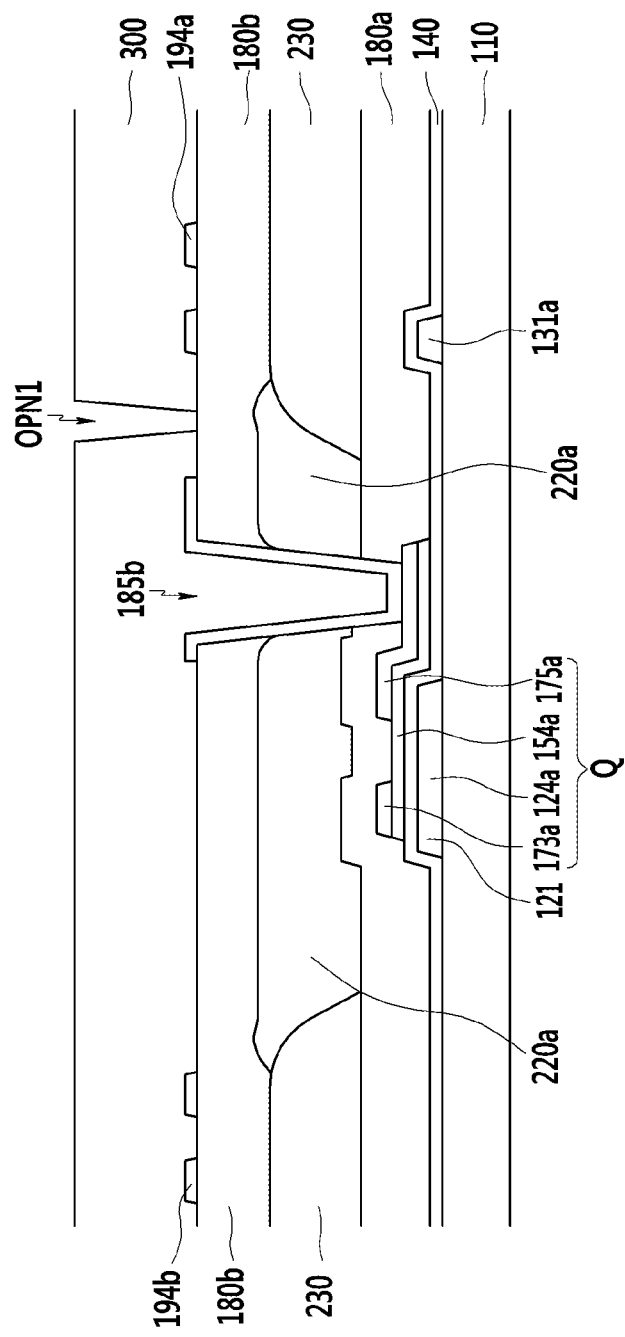
FIG. 9 to FIG. 31 are cross-sectional views of a liquid crystal display at different stages of manufacture according to an exemplary method of manufacturing the liquid crystal display.
Figure 10:
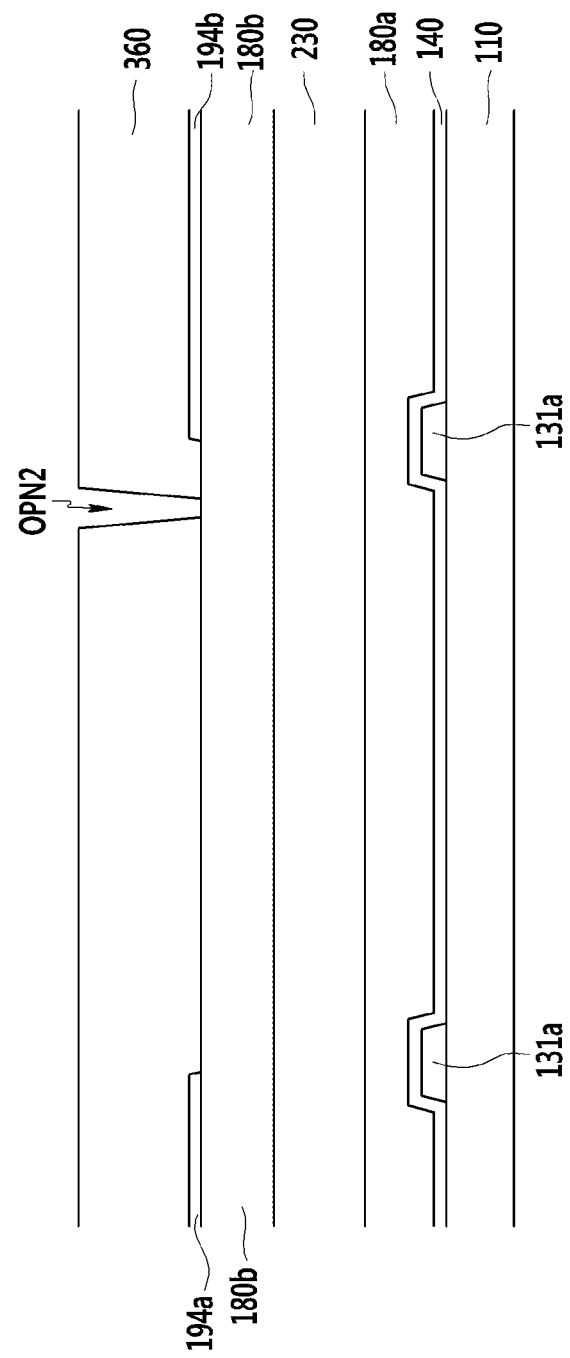
Figure 11:
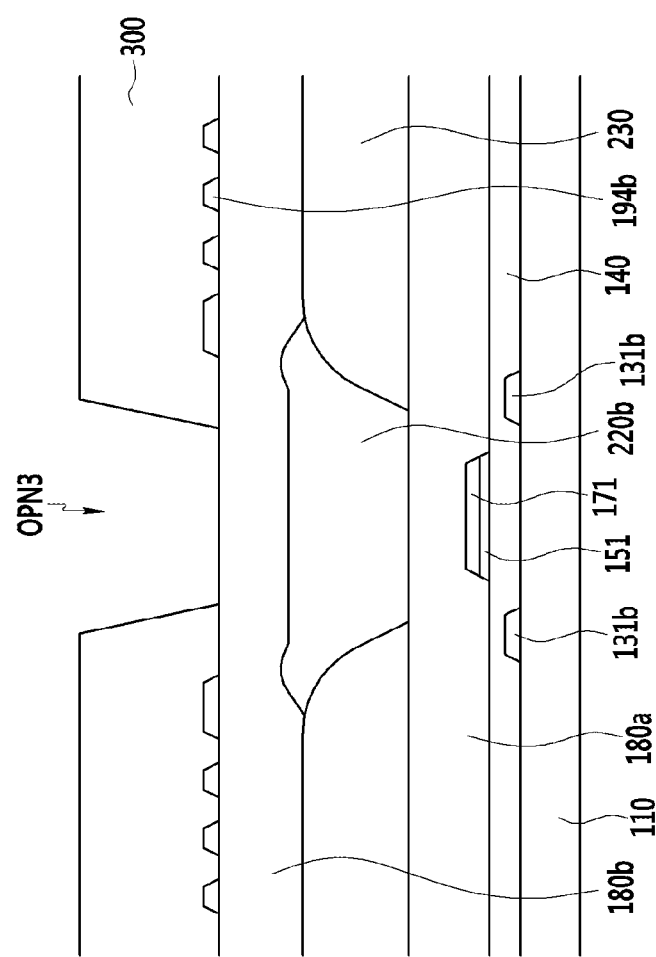
Figure 12:
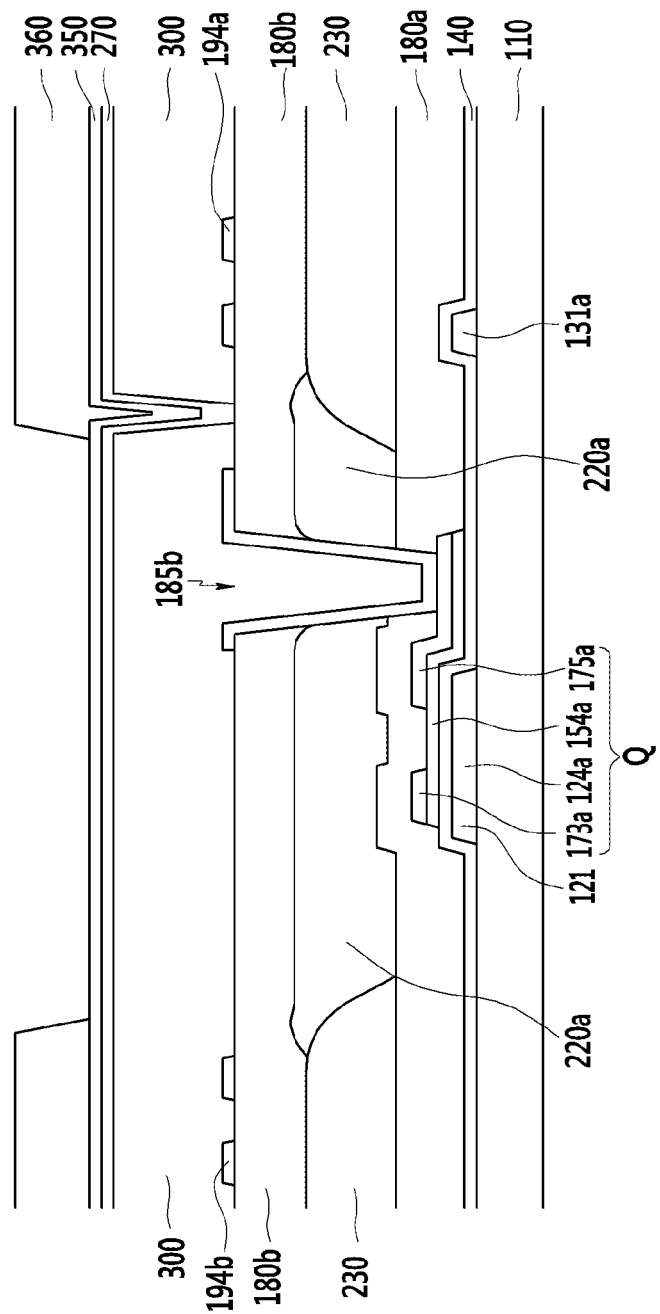

Next, the pixel electrode 191 is formed on the second interlayer insulating layer 180b, and a sacrificial layer 300 is formed on the pixel electrode 191. As shown in FIG. 9 to FIG. 11, a first opening OPN1, a second opening OPN2, and a third opening OPN3 are formed in the sacrificial layer 300. The first opening OPN1 is formed along an edge of a first sub-pixel area PX1, the second opening OPN2 is formed along an edge of the second sub-pixel area PX2, and the third opening OPN3 is formed along a direction that is parallel with the data line 171. A common electrode 270, a lower insulating layer 350, a roof layer 360, and an upper insulating layer 370 are formed in the first, second, and third openings OPN1, OPN2, and OPN3 such that a partitioning wall PW and a partitioning wall formation portion PWP may be formed in a subsequent process.

Figure 13:
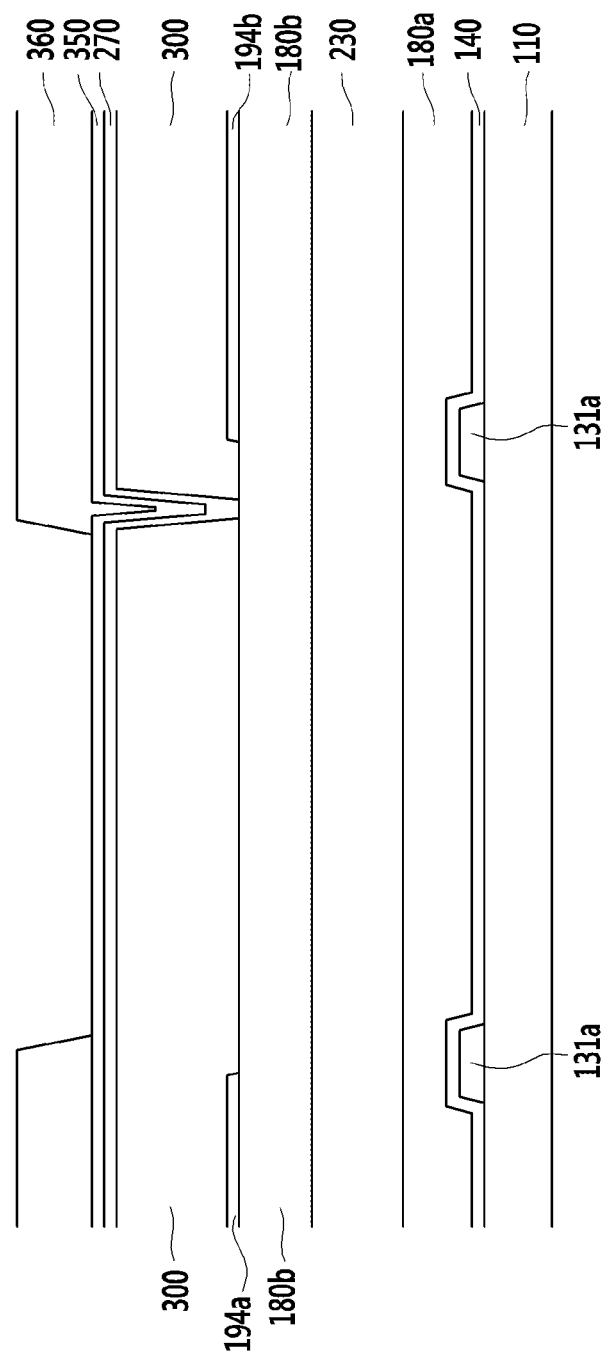

Referring to FIG. 2 and FIG. 12 to FIG. 14, the common electrode 270, the lower insulating layer 350, and the roof layer 360 are sequentially formed on the sacrificial layer 300. The roof layer 360 is disposed between pixel areas neighboring each other in a perpendicular direction. The roof layer 360 is patterned by exposure and developing processes, and a portion of the roof layer 360 may be removed in an area corresponding to the light blocking member 220a extending in the horizontal direction. In addition, as shown in FIG. 2 and FIG. 13, a portion of the roof layer 360 disposed between a first sub-pixel area PX1 of the lower pixel and a second sub-pixel area PX2 of the upper pixel among vertically neighboring pixels may be removed. In the above embodiment, it is noted that the remaining roof layer 360 should be sufficient to cover the first opening OPN1 and the second opening OPN2.

Figure 14:
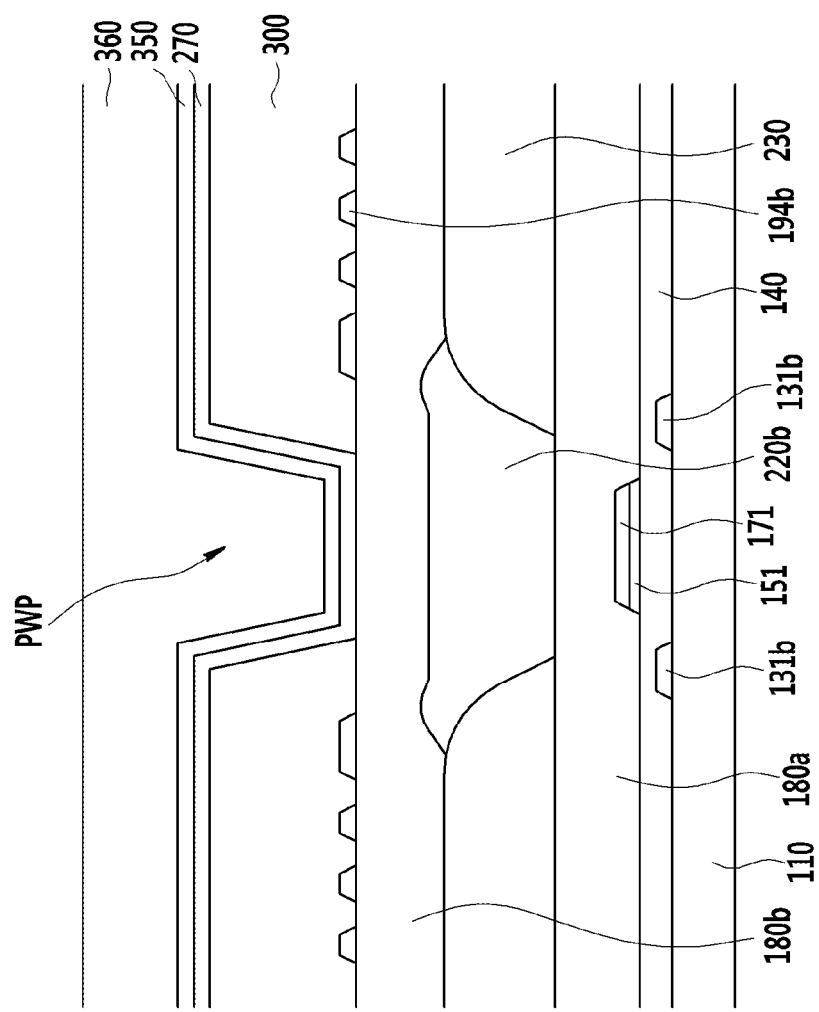

The roof layer 360 exposes the lower insulating layer 350 to the outside at a portion corresponding to an area (the area corresponding to the horizontally extended light blocking member 220a and between the first sub-pixel area PX1 of the lower pixel and the second sub-pixel area PX2 of the upper pixel). In the above embodiment, as shown in FIG. 14, the common electrode 270, the lower insulating layer 350, and the roof layer 360 form the partitioning wall formation portion PWP while filling the third opening OPN3 of the light blocking member 220b.

Figure 15:
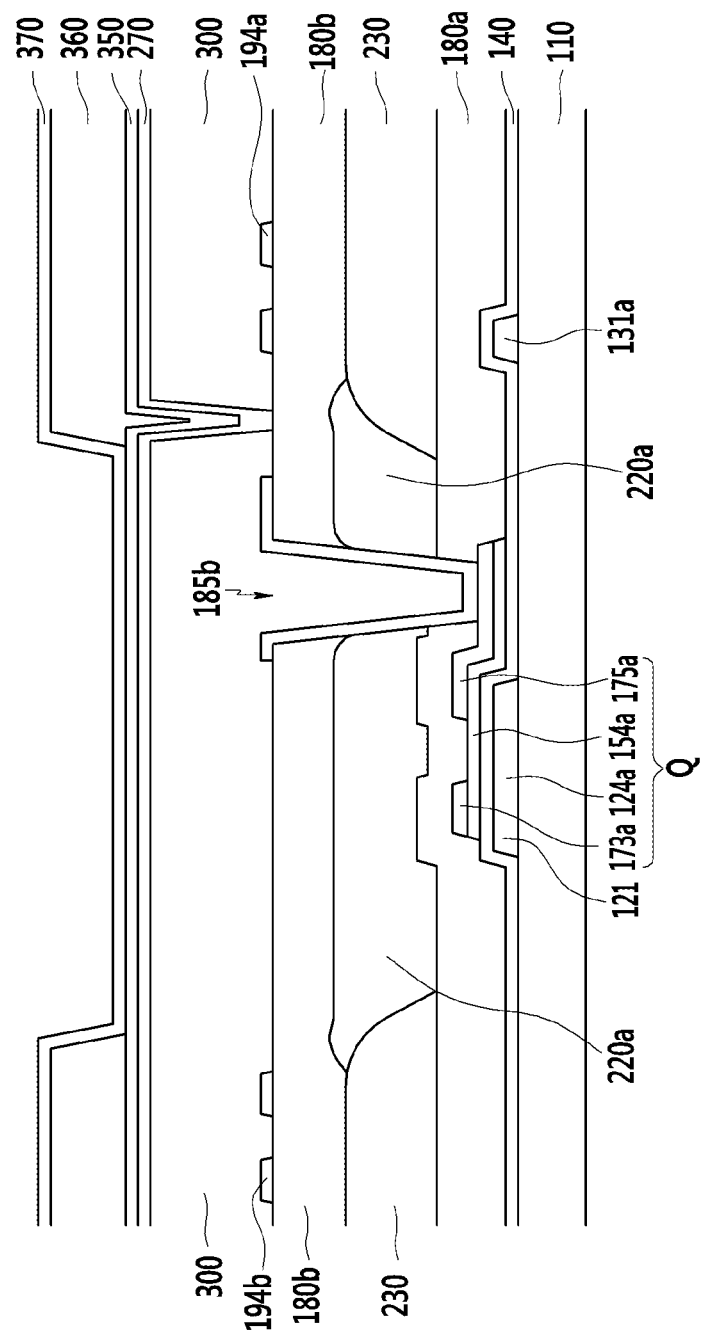
Figure 16:
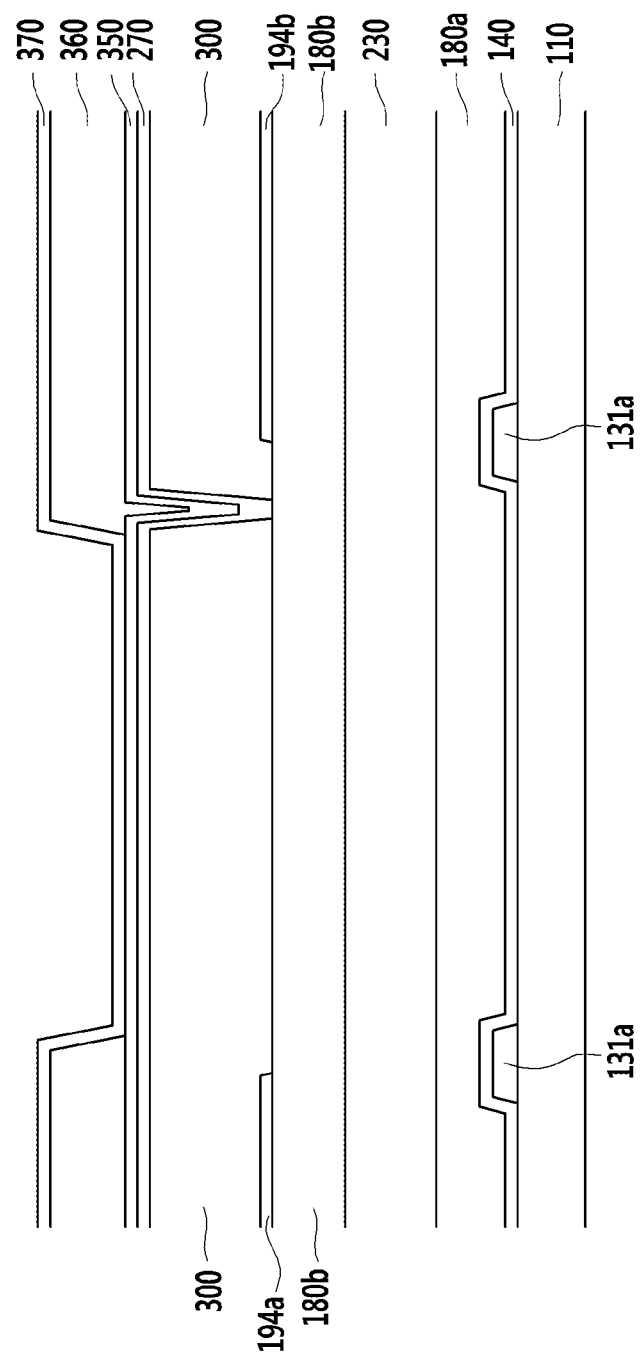
Figure 17:
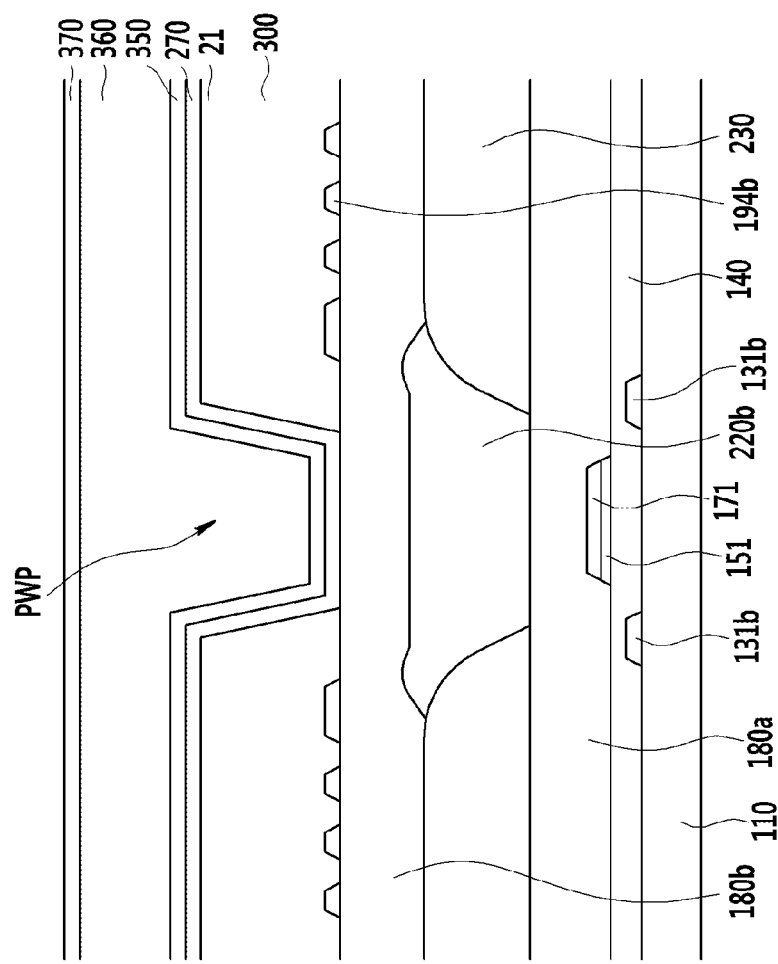

Referring to FIG. 15 to FIG. 17, the upper insulating layer 370 is formed covering the roof layer 360 and the exposed lower insulating layer 350.

Figure 18:
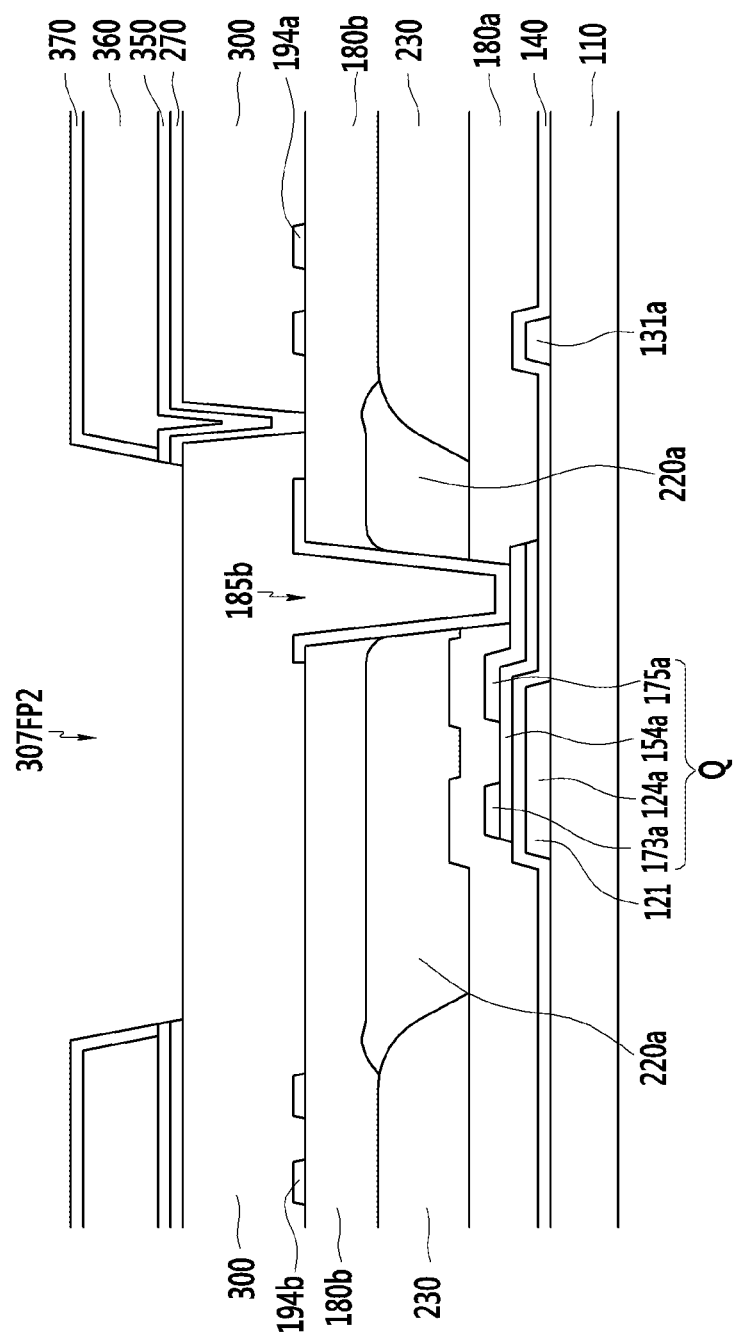
Figure 19:
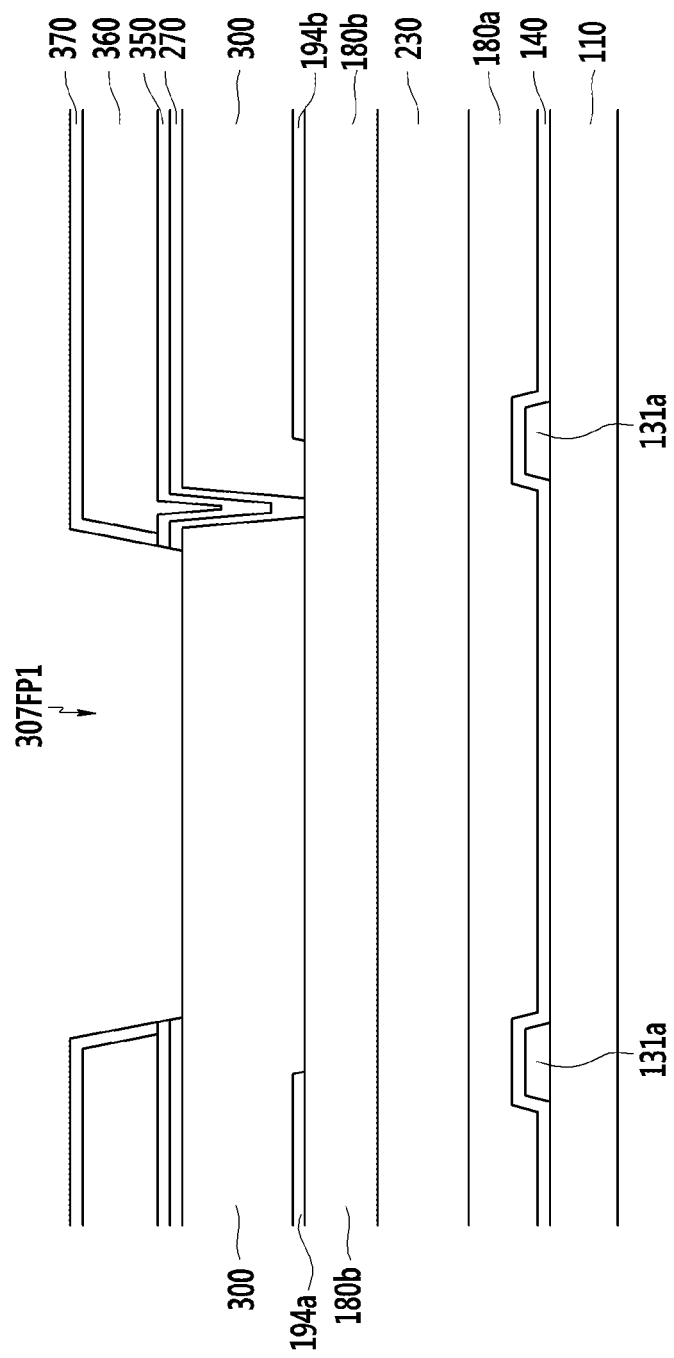

Referring to FIG. 18 and FIG. 19, the upper insulating layer 370, the lower insulating layer 350, and the common electrode 270 are dry-etched to partially remove the upper insulating layer 370, the lower insulating layer 350, and the common electrode 270 so that liquid crystal injection hole formation areas 307FP1 and 307FP2 are formed. The first liquid crystal injection hole formation area 307FP1 and the second liquid crystal injection hole formation area 307FP2 are formed parallel with a direction in which the gate line 121 extends. The first liquid crystal injection hole formation area 307FP1 is formed in a portion between the first sub-pixel area PX1 of the lower pixel and the second sub-pixel area PX2 of the upper pixel. The second liquid crystal injection hole formation area 307FP2 is formed in a portion corresponding to the horizontally-extended light blocking member 220a.

In the above embodiment, the upper insulating layer 370 may have a structure covering the side of the roof layer 360, but is not limited thereto. In some other embodiments, the upper insulating layer 370 covering the side of the roof layer 360 may be removed to expose the side of the roof layer 360 to the outside.

Figure 20:
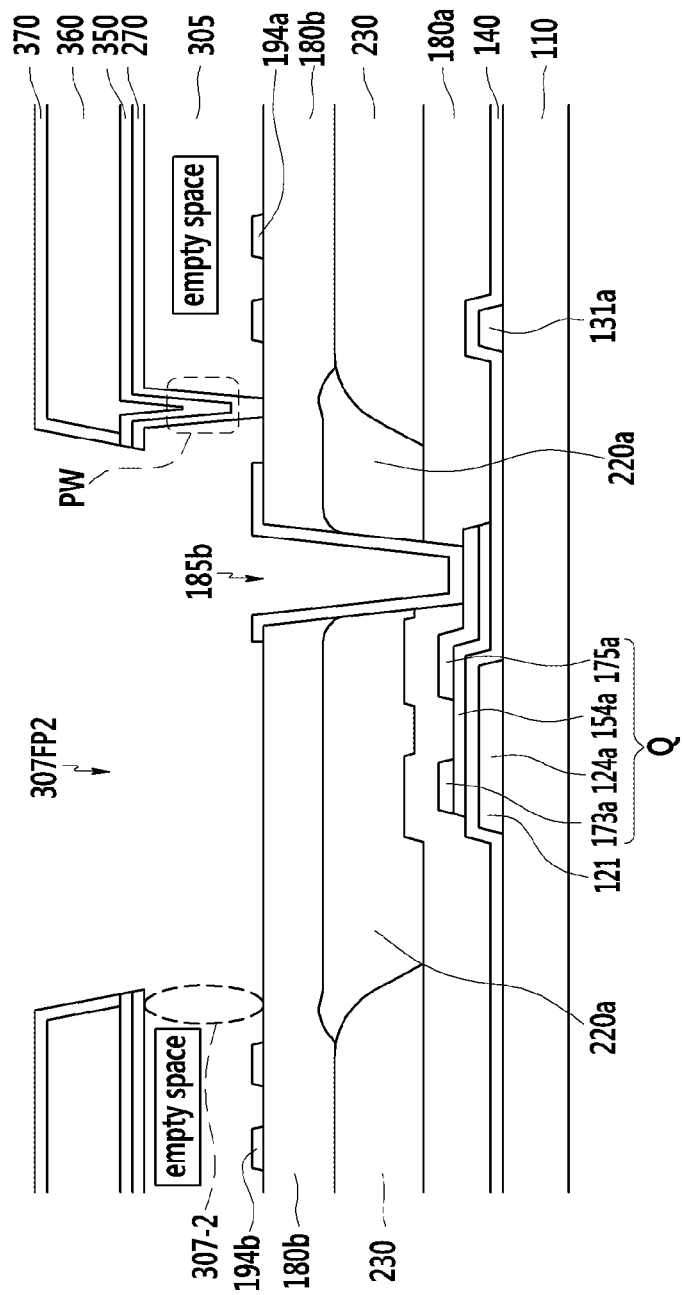
Figure 21:
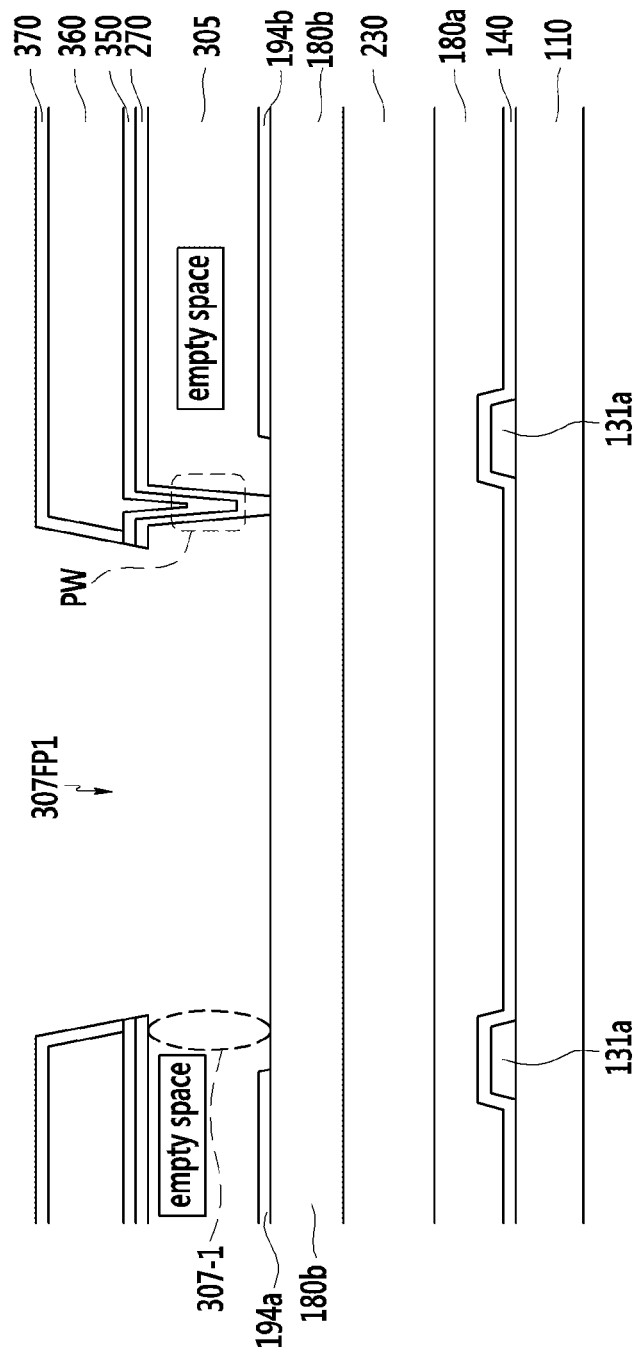
Figure 22:
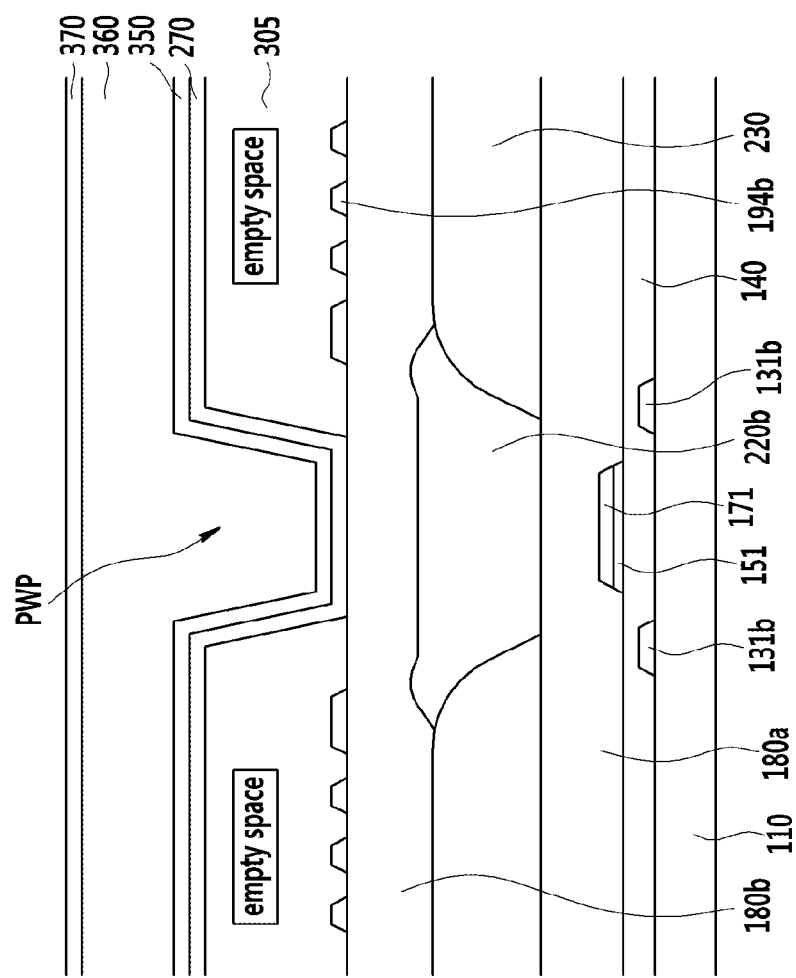
Figure 23:
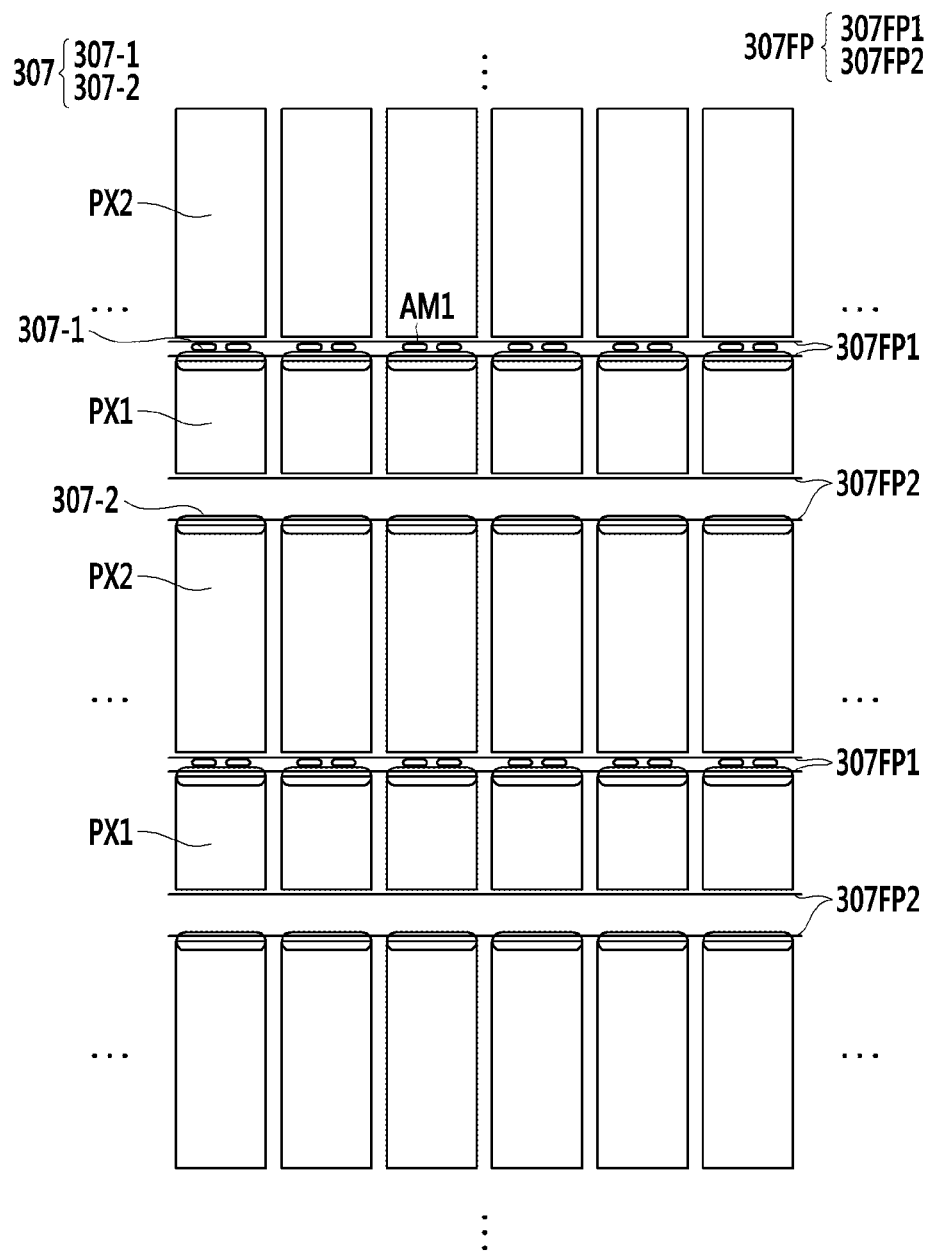

Referring to FIG. 20 to FIG. 22, the sacrificial layer 300 is removed by an oxygen (O2) ashing process or a wet-etching method through the injection hole formation area 307FP. Accordingly, the microcavity 305 having the injection holes 307-1 and 307-2 is formed. The microcavity 305 is an empty space that is formed when the sacrificial layer 300 is removed.

The first liquid crystal injection hole 307-1 is disposed in an upper end of the first sub-pixel area PX1, and the second liquid crystal injection hole 307-2 is disposed in an upper end of the second sub-pixel area PX2. However, the inventive concept is not limited to the above-described structure. In some other embodiments, the liquid crystal injection hole 307 may be disposed in a lower end of the first sub-pixel area PX1 and a lower end of the second sub-pixel area PX2.

Figure 24:
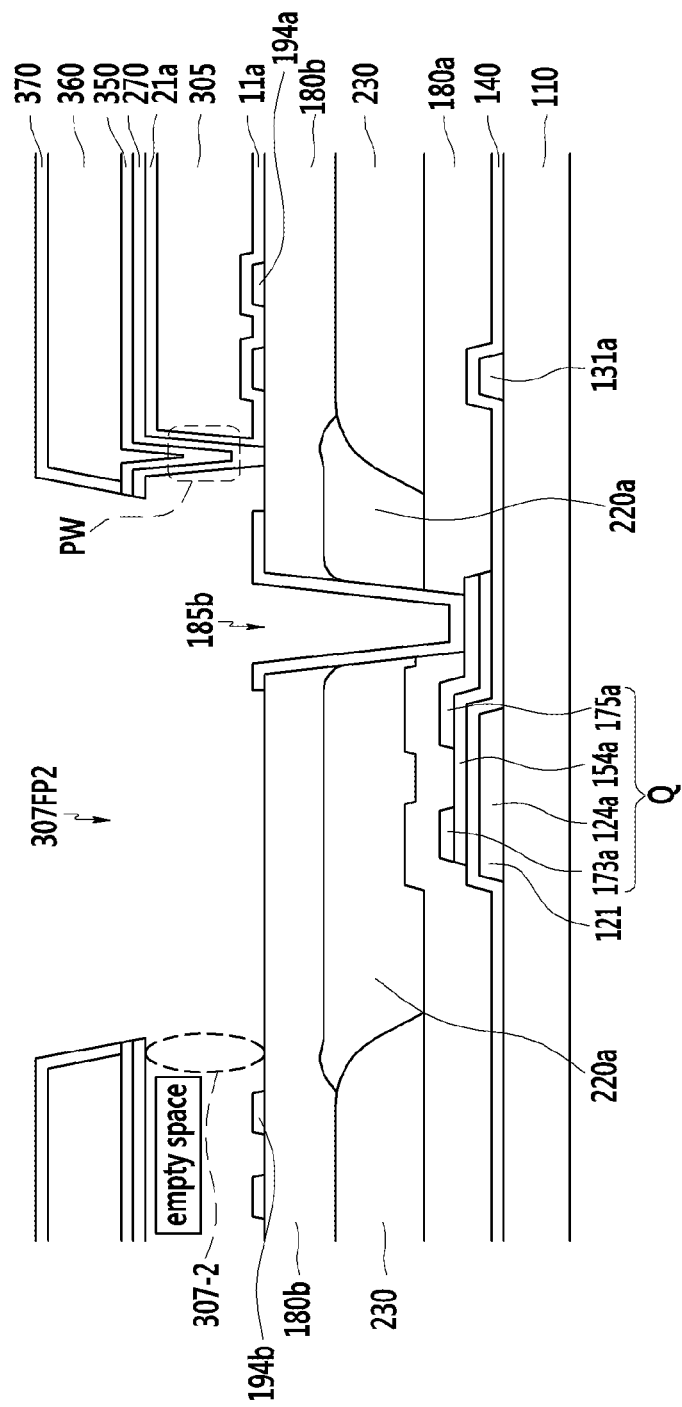
Figure 25:
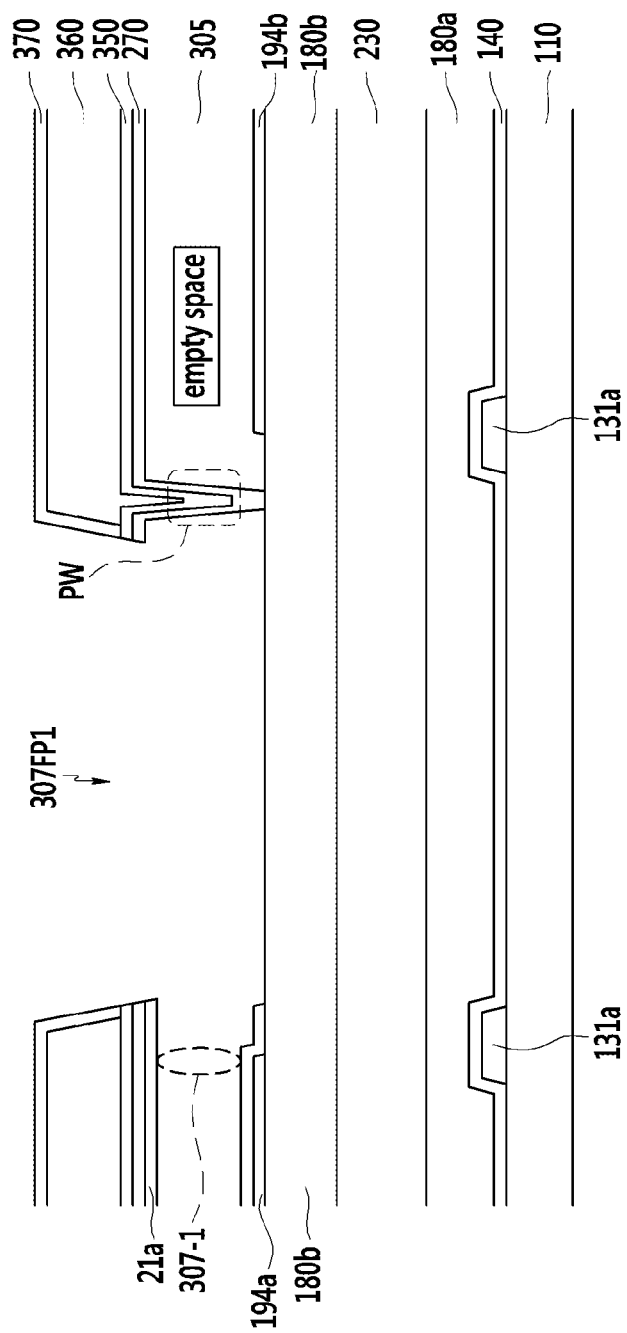
Figure 26:
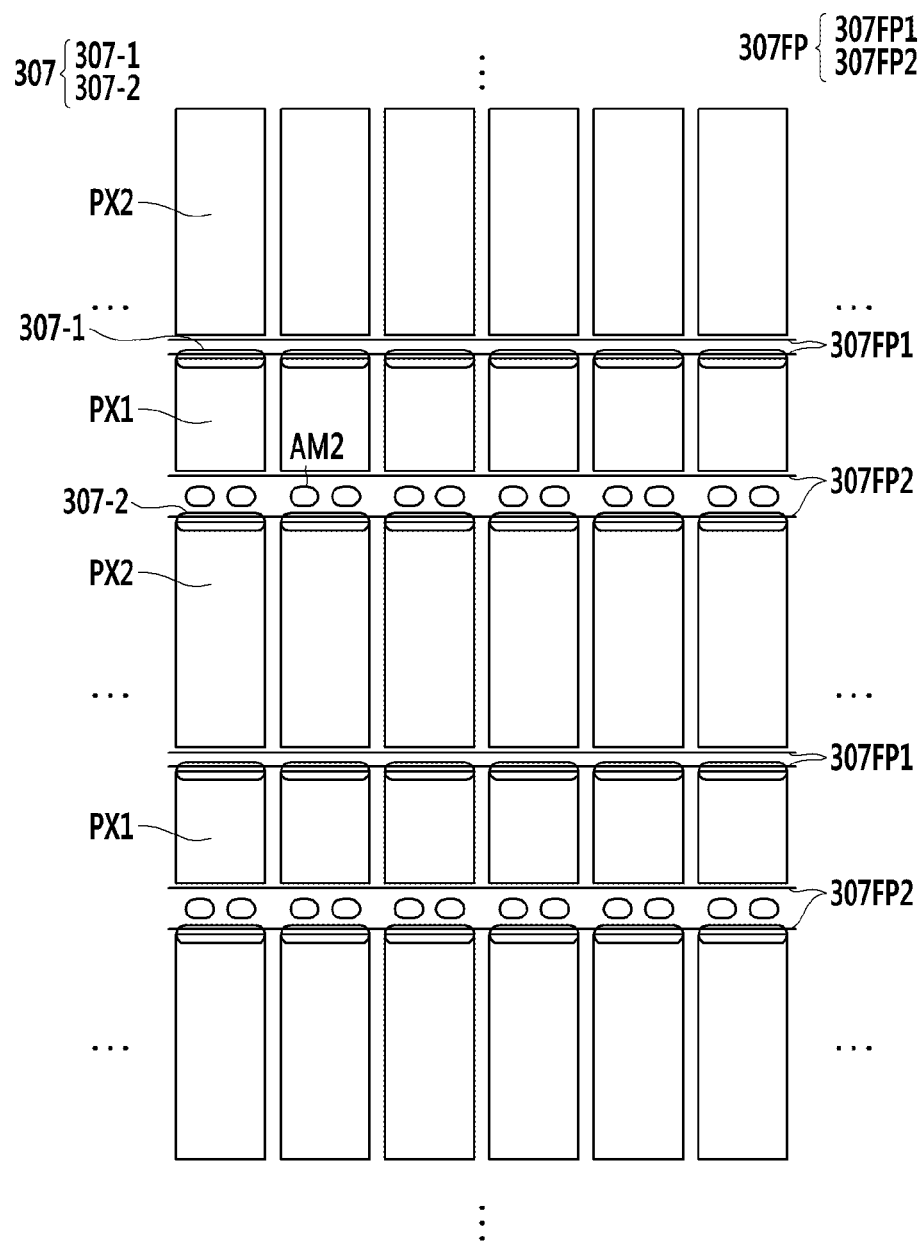

Referring to FIG. 23 to FIG. 25, a first alignment material AM1 is injected through the first liquid crystal injection hole formation area 307FP1 so that the first alignment material AM1 passes through the first liquid crystal injection hole 307-1 to fill the microcavity 305 of the first sub-pixel area PX1. In the above embodiment, the second sub-pixel area PX2 is not filled with the first alignment material AM1 because the first alignment material AM1 is blocked by the partitioning wall PW formed at one side of the first liquid crystal injection hole formation area 307FP1. The first alignment material AM1 may include a solid and a solvent, and first alignment layers 11a and 21a are formed on the pixel electrode 191 and the common electrode 270 through a baking process.

Figure 27:
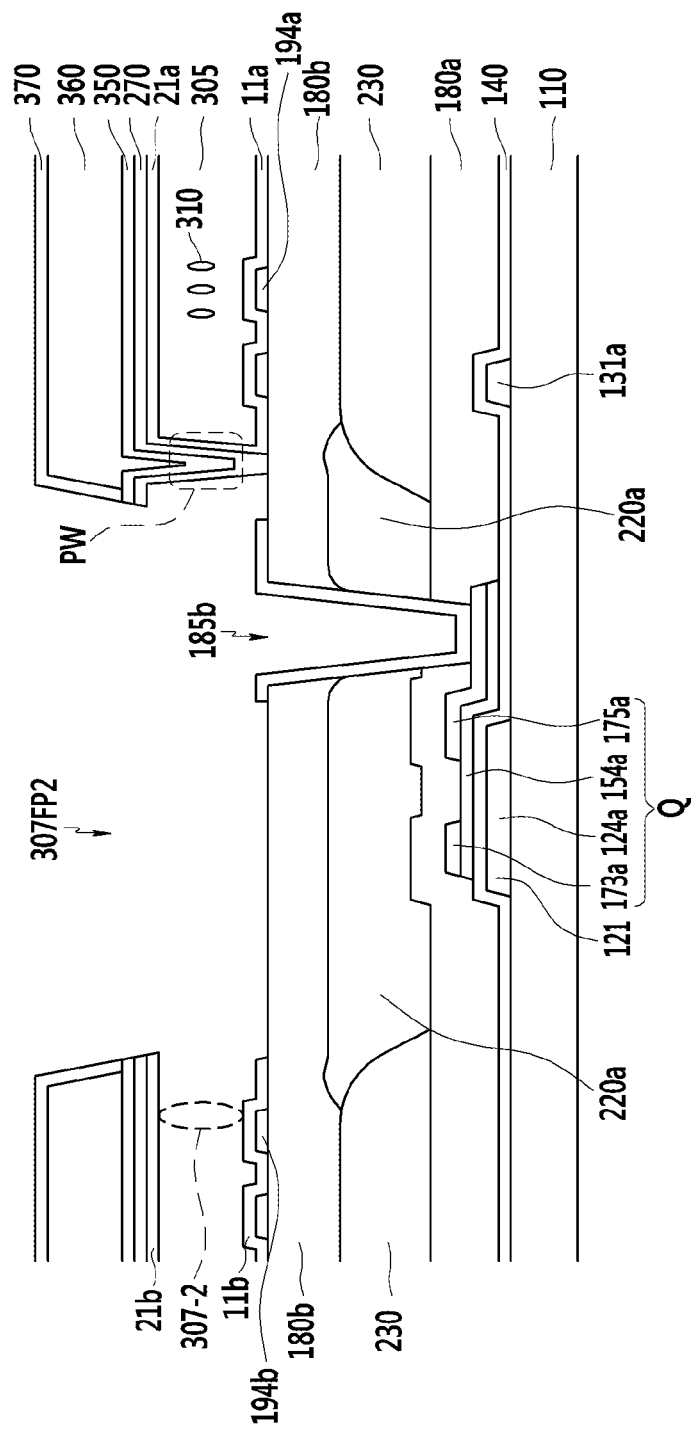
Figure 28:
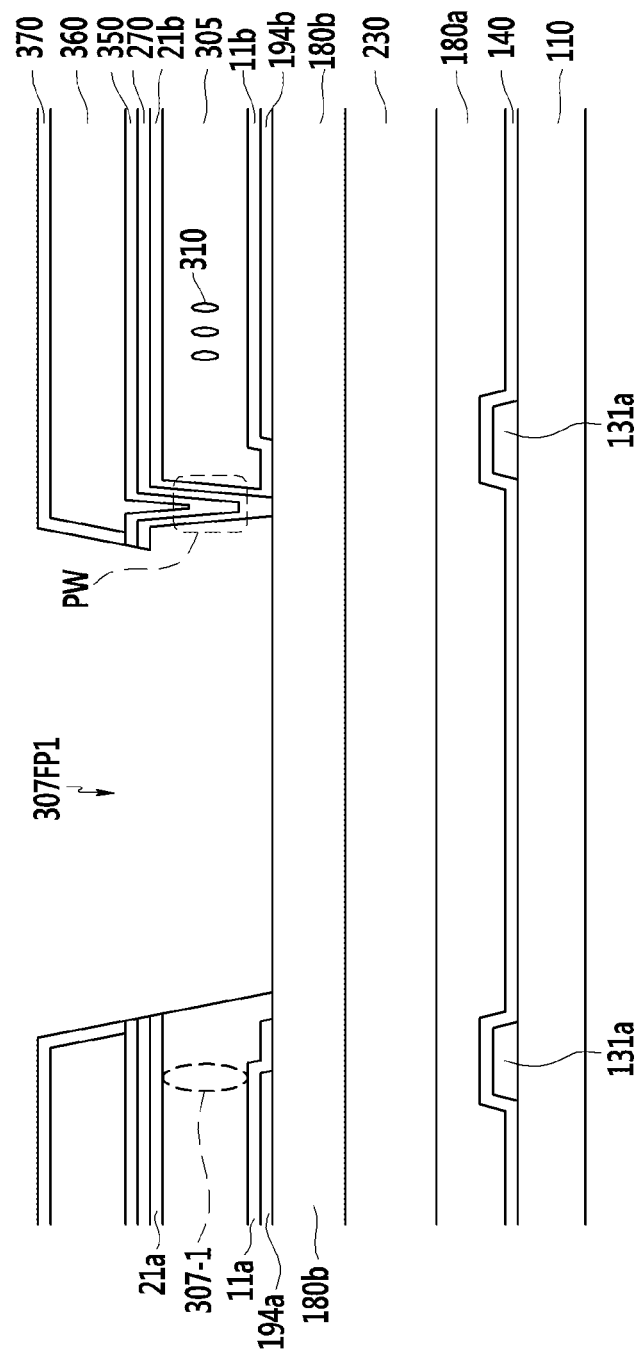

Referring to FIG. 26 to FIG. 28, a second alignment material AM2 is injected through the second liquid crystal injection hole formation area 307FP2 so that the second alignment material AM2 passes through the second liquid crystal injection hole 307-1 to fill the microcavity 305 of the second sub-pixel area PX2. In the above embodiment, the first sub-pixel area PX2 is not filled with the second alignment material AM2 because the second alignment material AM2 is blocked by the partitioning wall PW formed at one side of the second liquid crystal injection hole formation area 307FP2. The second alignment material AM2 may include a solid and a solvent, and second alignment layers 11b and 21b are formed on the pixel electrode 191 and the common electrode 270 through a baking process.

Figure 29:
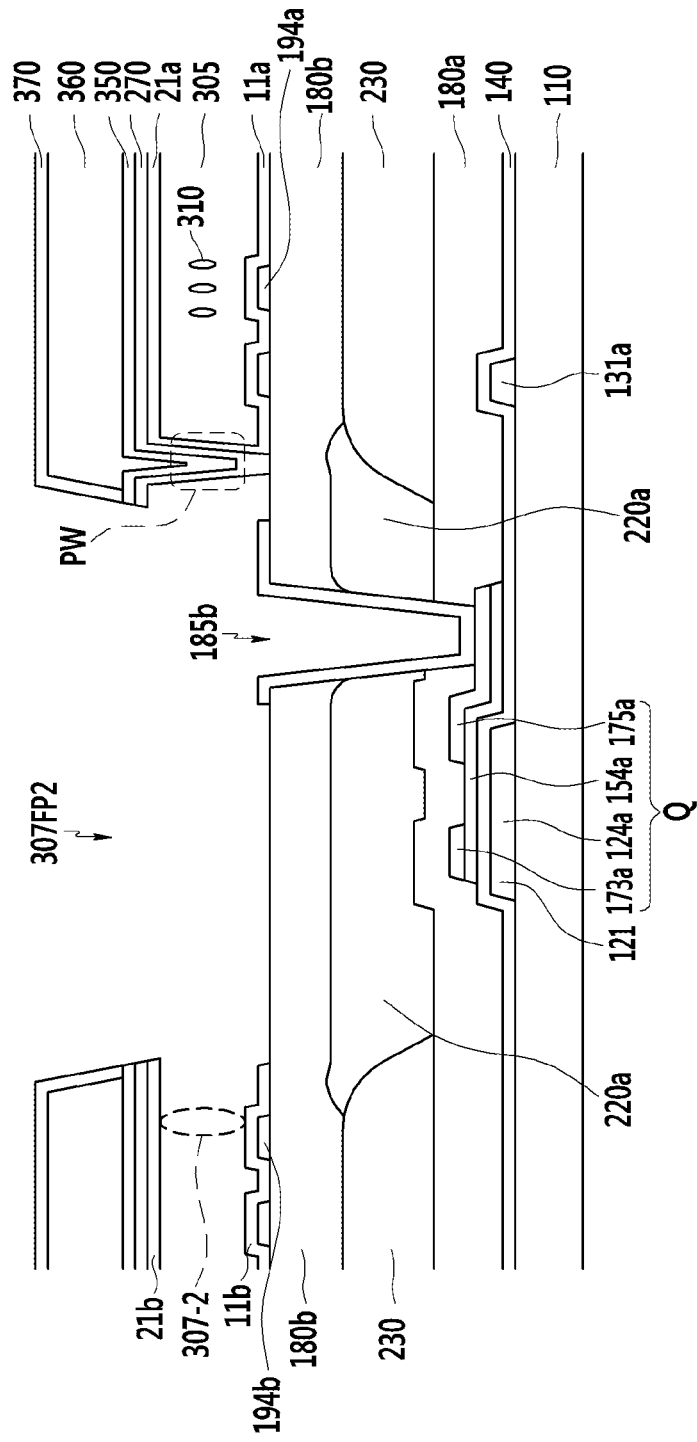
Figure 30:
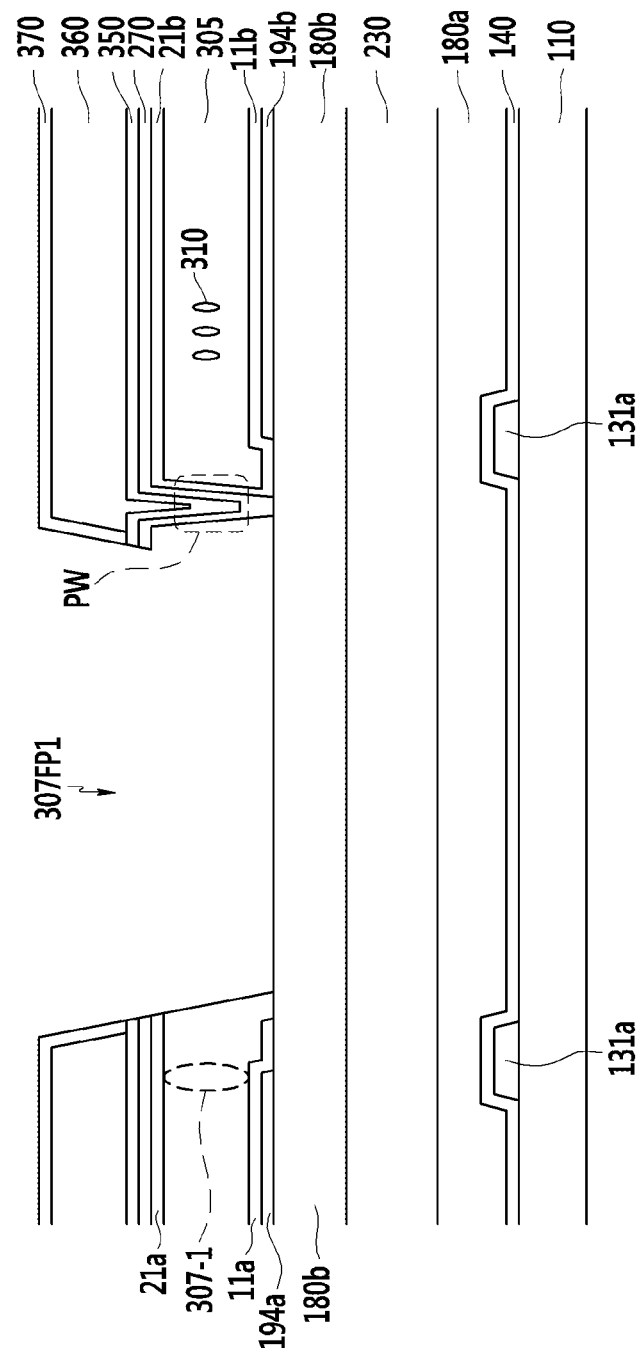
Figure 31:
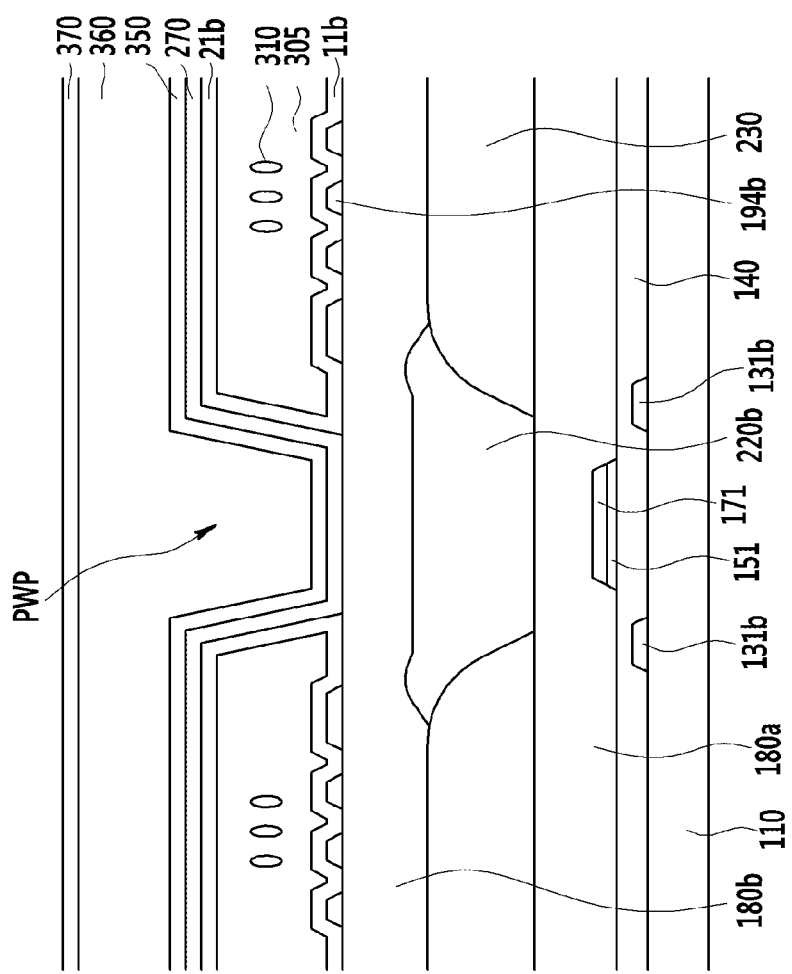

Referring to FIG. 29 to FIG. 31, a liquid crystal material including liquid crystal molecules 310 is injected through the first liquid crystal injection hole formation area 307FP1 and the second liquid crystal injection hole formation area 307FP2 using an inkjet method or other similar methods. The liquid crystal material then passes through the first liquid crystal injection hole 307-1 and the second liquid crystal injection hole 307-2 such that a liquid crystal layer is formed in the microcavity 305.

Next, a capping layer 390 is formed covering the liquid crystal injection hole 307 and the liquid crystal injection hole formation area 307FP on the upper insulating layer 370 so as to produce the liquid crystal display shown in FIG. 2 to FIG. 5.

Figure 32:
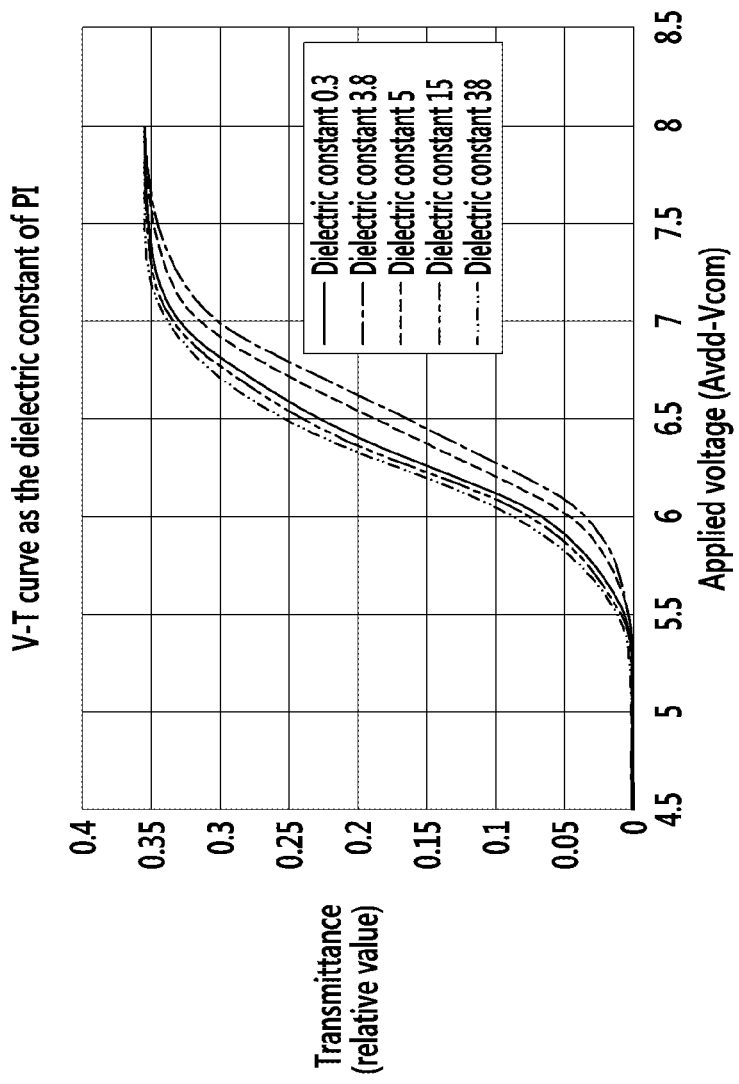
FIG. 32 is a graph illustrating the transmittance variation with voltage in a liquid crystal display according to an exemplary embodiment of the inventive concept.

FIG. 32 is a graph illustrating the transmittance variation with voltage in a liquid crystal display according to an exemplary embodiment of the inventive concept.

Referring to FIG. 32, it can be observed that the voltage-transmittance curves vary in a case that the dielectric constant is decreased with respect to a dielectric constant 3.8 of the alignment material PI, and the voltage-transmittance curves also vary in a case that the dielectric constant is increased with respect to a dielectric constant 3.8 of the alignment material PI. In particular, the transmittance is saturated when a voltage level is above 8 V, thereby realizing a full-white area. In the full-white area (that is, at a high gray), the transmittance hardly changes. However, the dielectric constant in a middle-gray area corresponding to 5 V to 7.5 V (which is an area having great variation in voltage-transmittance) may affect the gamma curve, thereby causing a variation in visibility.

Figure 33:
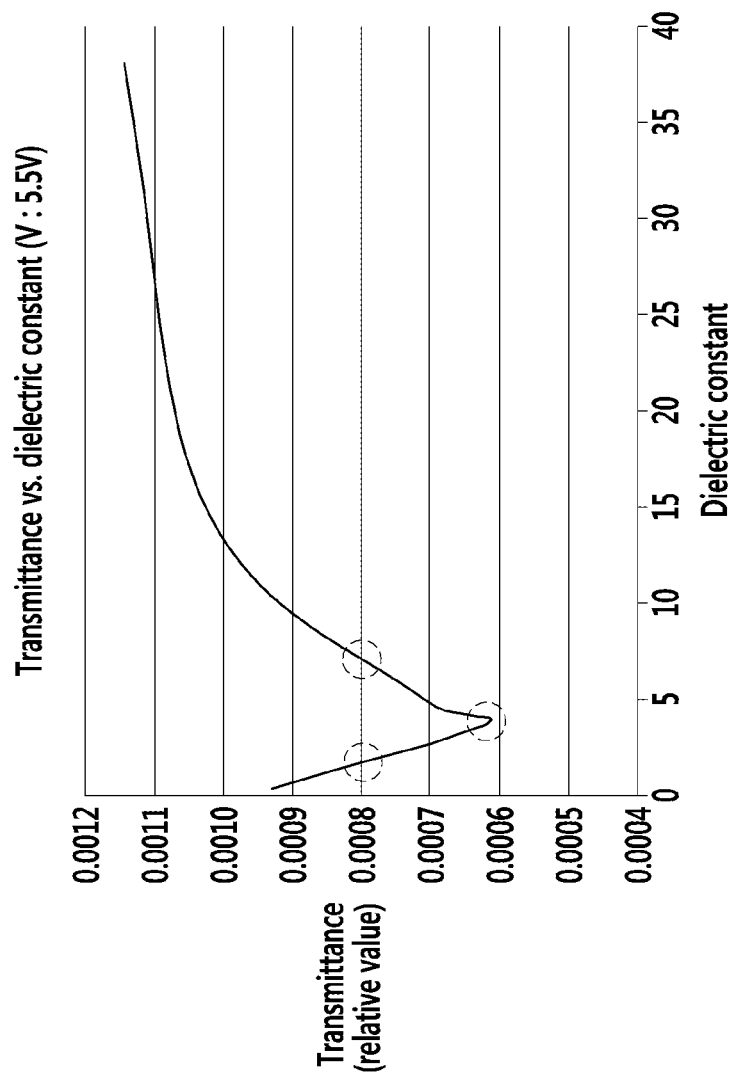
FIG. 33 is a graph illustrating the transmittance variation with dielectric constant when a voltage is fixed at 5.5 V in the embodiment of FIG. 32.

FIG. 33 is a graph illustrating the transmittance variation with dielectric constant when a voltage is fixed at 5.5 V in the embodiment of FIG. 32.

Referring to FIG. 33, the dielectric constants of an area (where transmittance is changed by about 30% with reference to transmittance at a dielectric constant of 3.8) correspond to 1.8 and 7.0. Here, the transmittance at the dielectric constant of 3.8 is the lowest transmittance. Thus, in the liquid crystal display according to the exemplary embodiment of the inventive concept, a dielectric constant difference of the alignment materials is set to be greater than 2 so as to produce a transmittance difference about 30%, thereby improving visibility.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A liquid crystal display comprising:
a substrate including a plurality of pixel areas;
a thin film transistor disposed on the substrate;
a pixel electrode connected with the thin film transistor; and
a roof layer disposed facing the pixel electrode,
wherein a plurality of microcavities are disposed between the pixel electrode and the roof layer, and a liquid crystal layer including liquid crystal molecules is disposed in the plurality of microcavities,
wherein each microcavity comprises a first area and a second area partitioned in a direction parallel to the substrate by a liquid crystal injection hole formation area, and a first alignment layer in the first area and a second alignment layer in the second area are formed of different materials,
wherein a partitioning wall is formed in a portion facing the liquid crystal injection hole formation area with reference to a first liquid crystal injection hole formation area and a second liquid crystal injection hole formation area,
wherein a first side of the first alignment layer in the first area is blocked by the partitioning wall and a first injection hole is formed at a second side of the first alignment layer that is opposite to the first side of the first alignment layer, wherein a first side of the second alignment layer in the second area is blocked by the partitioning wall and a second injection hole is formed at a second side of the second alignment layer that is opposite to the first side of the second alignment layer, and wherein the second side of the first alignment layer faces the first side of the second alignment layer in the liquid crystal injection hole formation area.

2. The liquid crystal display of claim 1, wherein the first alignment layer and the second alignment layer have different dielectric constants.

3. The liquid crystal display of claim 2, wherein a difference between the dielectric constants of the first alignment layer and the second alignment layer is equal to or greater than 2.

4. The liquid crystal display of claim 3, wherein
the first liquid crystal injection hole formation area and the second liquid crystal injection hole formation area are alternately arranged in a column direction, and
a thin film transistor is formed in an area corresponding to the second liquid crystal injection hole formation area.

5. The liquid crystal display of claim 4, wherein the plurality of pixel areas comprise a first pixel area and a second pixel area neighboring each other, wherein a first sub-pixel electrode and a second sub-pixel electrode are disposed in the first pixel area, and a third sub-pixel electrode and a fourth sub-pixel electrode are disposed in the second pixel area, and wherein the first liquid crystal injection hole formation area is disposed between the second sub-pixel electrode and the third sub-pixel electrode, and the second liquid crystal injection hole formation area is disposed between the first sub-pixel electrode and the second sub-pixel electrode and between the third sub-pixel electrode and the fourth sub-pixel electrode.

6. The liquid crystal display of claim 4, wherein a single liquid crystal injection hole is disposed in each of the first liquid crystal injection hole formation area and the second liquid crystal injection hole formation area.

7. The liquid crystal display of claim 1, wherein the partitioning wall includes a downward protruding portion of the roof layer.

8. The liquid crystal display of claim 1, further comprising an interlayer insulating layer disposed between the thin film transistor and the pixel electrode, wherein the partitioning wall includes an upward protruding portion of the interlayer insulating layer.

9. The liquid crystal display of claim 1, wherein when an electric field is applied to the liquid crystal layer, a tilting degree of the liquid crystal molecules in the first area and a tilting degree of the liquid crystal molecules in the second area are different from each other.

* * * * *